(12) United States Patent
Son et al.

(10) Patent No.: US 12,396,173 B2
(45) Date of Patent: Aug. 19, 2025

(54) SEMICONDUCTOR MEMORY DEVICE, METHOD FOR FABRICATING THE SAME AND ELECTRONIC SYSTEM INCLUDING THE SAME

(71) Applicant: Samsung Electronics Co., Ltd., Suwon-si (KR)

(72) Inventors: Yong-Hoon Son, Yongin-si (KR); Joon Sung Kim, Seoul (KR); Suk Kang Sung, Seongnam-si (KR); Gil Sung Lee, Seongnam-si (KR); Jong-Min Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 420 days.

(21) Appl. No.: 17/900,172

(22) Filed: Aug. 31, 2022

(65) Prior Publication Data
US 2023/0114139 A1 Apr. 13, 2023

(30) Foreign Application Priority Data
Oct. 8, 2021 (KR) ........................ 10-2021-0134118

(51) Int. Cl.
*H01L 23/535* (2006.01)
*H01L 21/768* (2006.01)
(Continued)

(52) U.S. Cl.
CPC ....... *H10B 43/27* (2023.02); *H01L 21/76805* (2013.01); *H01L 21/76816* (2013.01);
(Continued)

(58) Field of Classification Search
CPC ........ H10B 43/00; H10B 43/27; H10B 43/30; H10B 43/35; H10B 43/40; H10B 43/50;
(Continued)

(56) References Cited

U.S. PATENT DOCUMENTS 9,583,500 B2 2/2017 Pachamuthu et al.
9,960,181 B1 5/2018 Cui et al.
(Continued)

FOREIGN PATENT DOCUMENTS

KR 2023/0025602 A 2/2023

*Primary Examiner* — Zandra V Smith
*Assistant Examiner* — Douglas Yap
(74) *Attorney, Agent, or Firm* — HARNESS, DICKEY & PIERCE, P.L.C.

(57) ABSTRACT

A semiconductor memory device may include a cell substrate including a cell array region and an extension region, a first mold structure on the cell substrate, a second mold structure on the first mold structure, a channel structure passing through the first and second mold structures on the cell array region, and a cell contact structure passing through the first and second mold structures on the extension region. The first mold structure and the second mold structure respectively include first gate electrodes and second gate electrodes sequentially stacked on the cell array region and stacked in a stepwise manner on the extension region. The cell contact structure includes a lower conductive pattern connected to one of the first gate electrodes, an upper conductive pattern connected to one of the second gate electrodes, and an insulating pattern separating the lower conductive pattern from the upper conductive pattern.

20 Claims, 40 Drawing Sheets

(51) Int. Cl.
*H01L 23/522* (2006.01)
*H10B 43/27* (2023.01)
*H10B 43/40* (2023.01)

(52) U.S. Cl.
CPC .... *H01L 21/76831* (2013.01); *H01L 23/5226* (2013.01); *H01L 23/535* (2013.01); *H10B 43/40* (2023.02); *H01L 2224/023* (2013.01)

(58) Field of Classification Search
CPC ... H01L 23/52; H01L 23/535; H01L 23/5226; H01L 23/522; H01L 23/481; H01L 23/48; H01L 23/5384; H01L 25/50; H01L 25/105; H01L 25/16; H01L 25/162; H01L 25/117; H01L 2225/06541; H01L 2225/06548; H01L 2225/06544; H01L 2224/023; H01L 2224/06137–06139; H01L 2224/06147–06159; H01L 2224/06167–06169; H01L 2224/05024; H01L 2224/05548; H01L 2224/05; H01L 2224/569; H01L 2224/13008; H01L 2224/13024; H01L 2224/29; H01L 2224/29024; H01L 2224/05008; H01L 21/76802; H01L 21/76816; H01L 21/76829; H01L 21/76831; H01L 21/76805; H01L 2221/1015–1036
See application file for complete search history.

(56) References Cited

U.S. PATENT DOCUMENTS

| | | |
|---|---|---|
| 9,991,271 B2 | 6/2018 | Kang et al. |
| 10,283,566 B2 | 5/2019 | Sel et al. |
| 10,622,369 B2 | 4/2020 | Zhou et al. |

SEMICONDUCTOR MEMORY DEVICE, METHOD FOR FABRICATING THE SAME AND ELECTRONIC SYSTEM INCLUDING THE SAME

CROSS-REFERENCE TO RELATED APPLICATION

This application claims priority from Korean Patent Application No. 10-2021-0134118, filed on Oct. 8, 2021 in the Korean Intellectual Property Office, and all the benefits accruing therefrom under 35 U.S.C. 119, the entire contents of which are herein incorporated by reference.

BACKGROUND

1. Technical Field

The present disclosure relates to a semiconductor memory device, a method for fabricating the same, and/or an electronic system including the same. More particularly, the present disclosure relates to a semiconductor memory device including a multi-stack, a method for fabricating the same, and/or an electronic system including the same.

2. Description of the Related Art

In order to satisfy consumer demands for superior performance and inexpensive prices, increasing the integration density of semiconductor memory devices may be desired. In a semiconductor memory device, since the integration density of the semiconductor memory device is an important factor in determining the price of a product, an increased integration density particularly may be required.

Meanwhile, in the case of a two-dimensional or planar semiconductor memory device, the integration density mainly may be determined by the area occupied by a unit memory cell, and thus the integration density may be greatly influenced by the level of fine pattern formation technology. However, since extremely high-priced equipment may be required for the miniaturization of patterns, the integration density of the two-dimensional semiconductor devices has been increased but still may be limited. Accordingly, three-dimensional semiconductor devices having memory cells arranged three-dimensionally have been proposed.

SUMMARY

Aspects of the present disclosure provide a semiconductor memory device that facilitates miniaturization of a product.

Aspects of the present disclosure also provide a method for fabricating a semiconductor memory device that facilitates miniaturization of a product.

Aspects of the present disclosure also provide an electronic system including a semiconductor memory device that facilitates miniaturization of a product.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an embodiment, a semiconductor memory device may include a cell substrate including a cell array region and an extension region; a first mold structure on the cell substrate, the first mold structure including a plurality of first gate electrodes sequentially stacked on the cell array region and stacked in a stepwise manner on the extension region; a second mold structure on the first mold structure, the second mold structure including a plurality of second gate electrodes sequentially stacked on the first mold structure on the cell array region and stacked in a stepwise manner on the extension region; a channel structure passing through the first mold structure and the second mold structure on the cell array region; and a cell contact structure passing through the first mold structure and the second mold structure on the extension region. The cell contact structure may include a lower conductive pattern connected to one of the plurality of first gate electrodes, an upper conductive pattern connected to one of the plurality of second gate electrodes, and an insulating pattern separating the lower conductive pattern from the upper conductive pattern.

According to an embodiment, a semiconductor memory device may include a cell substrate including a cell array region and an extension region; a first mold structure on the cell substrate, the first mold structure including a plurality of first gate electrodes sequentially stacked on the cell array region, each of the plurality of first gate electrodes including a first pad region in which a part of an upper surface thereof is exposed on the extension region; a second mold structure on the first mold structure, the second mold structure including a plurality of second gate electrodes sequentially stacked on the first mold structure, each of the plurality of second gate electrodes including a second pad region in which a part of an upper surface thereof is exposed on the extension region; a channel structure extending in a vertical direction intersecting an upper surface of the cell substrate on the cell array region, the channel structure passing through the first mold structure and the second mold structure; a word line cutting region extending in a first direction crossing the vertical direction to cut the first mold structure and the second mold structure; a bit line extending in a second direction crossing the first direction and the vertical direction, the bit line connected to the channel structure; a cell contact structure extending in the vertical direction on the extension region, the cell contact structure passing through the first mold structure and the second mold structure; and an insulating ring between the cell contact structure and each of the plurality of first gate electrodes and between the cell contact structure and each of the plurality of second gate electrodes. The cell contact structure may include a lower conductive pattern in contact with the pad region of a corresponding first gate electrode among the plurality of first gate electrodes, an upper conductive pattern in contact with the second pad region of a corresponding second gate electrode among the plurality of second gate electrodes, and an insulating pattern separating the lower conductive pattern from the upper conductive pattern.

According to an embodiment, a method for fabricating a semiconductor memory device may include providing a cell substrate comprising a cell array region and an extension region; forming a first mold structure on the cell substrate, the first mold structure including a plurality of first gate electrodes sequentially stacked on the cell substrate, each of the plurality of first gate electrodes including a first pad region in which a part of an upper surface thereof is exposed on the extension region; forming a second mold structure on the first mold structure, the second mold structure including a plurality of second gate electrodes sequentially stacked on the first mold structure, each of the plurality of second gate electrodes including a second pad region in which a part of an upper surface thereof is exposed on the extension region; forming a channel structure passing through the first mold structure and the second mold structure on the cell array region; forming a cell contact hole passing through the first mold structure and the second mold structure on the extension region; forming an insulating ring between the cell contact hole and each of the plurality of first gate electrodes and between the cell contact hole and each of the plurality of second gate electrodes; exposing at least a part of the first pad region of at least one of the plurality of first gate electrodes and at least a part of the second pad region of at least one of the plurality of second gate electrodes of the second pad region by expanding the cell contact hole; and forming a cell contact structure by filling the cell contact hole. The cell contact structure may include a lower conductive pattern in contact with the first pad region of the first gate electrode, an upper conductive pattern in contact with the second pad region of the second gate electrode, and an insulating pattern separating the lower conductive pattern from the upper conductive pattern.

According to an embodiment, an electronic system may include a main substrate; a semiconductor memory device on the main substrate; and a controller on the main substrate, the controller being electrically connected to the semiconductor memory device. The semiconductor memory device may include a cell substrate, a first mold structure on the cell substrate, a second mold structure on the first mold structure, a channel structure, and a cell contact structure. The cell substrate may include a cell array region and an extension region. The first mold structure may include a plurality of first gate electrodes sequentially stacked on the cell array region and stacked in a stepwise manner on the extension region. The second mold structure may include a plurality of second gate electrodes sequentially stacked on the first mold structure and stacked in a stepwise manner on the extension region. The channel structure may pass through the first mold structure and the second mold structure on the cell array region. The cell contact structure may pass through the first mold structure and the second mold structure on the extension region. The cell contact structure may include a lower conductive pattern electrically connecting one of the plurality of first gate electrodes to the controller, an upper conductive pattern electrically connecting one of the plurality of second gate electrodes to the controller, and an insulating pattern separating the lower conductive pattern from the upper conductive pattern.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION

Hereinafter, a semiconductor memory device according to example embodiments will be described with reference to FIGS. 1 to 13.

Figure 1:
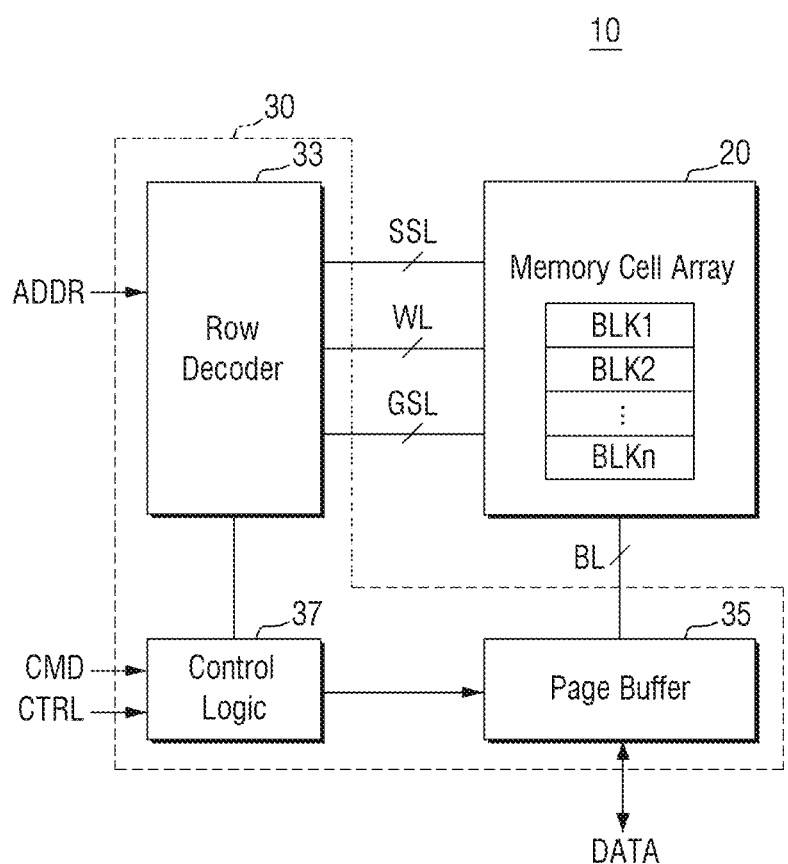
FIG. 1 is an example block diagram for explaining a semiconductor memory device according to some embodiments.

FIG. 1 is an example block diagram explaining a semiconductor memory device according to some embodiments.

Referring to FIG. 1, a semiconductor memory device 10 according to some embodiments includes a memory cell array 20 and a peripheral circuit 30.

The memory cell array 20 may include a plurality of memory cell blocks BLK1 to BLKn. Each of the memory cell blocks BLK1 to BLKn may include a plurality of memory cells. The memory cell array 20 may be connected to the peripheral circuit 30 through bit lines BL, word lines WL, at least one of string select lines SSL, and at least one of ground select lines GSL. Specifically, the memory cell blocks BLK1 to BLKn may be connected to a row decoder 33 through the word lines WL, the string select lines SSL, and the ground select lines GSL. Further, the memory cell blocks BLK1 to BLKn may be connected to a page buffer 35 through the bit lines BL.

The peripheral circuit 30 may receive an address ADDR, a command CMD, and a control signal CTRL from the outside of the semiconductor memory device 10, and may transmit and receive data DATA to and from an external device of the semiconductor memory device 10. The peripheral circuit 30 may include a control logic 37, the row decoder 33 and the page buffer 35. Although not shown, the peripheral circuit 30 may further include various sub-circuits such as an input/output circuit, a voltage generation circuit for generating various voltages required for the operation of the semiconductor memory device 10, and an error correction circuit for correcting an error of data DATA read from the memory cell array 20.

The control logic 37 may be connected to the row decoder 33, the input/output circuit and the voltage generation circuit. The control logic 37 may control an overall operation of the semiconductor memory device 10. The control logic 37 may generate various internal control signals used in the semiconductor memory device 10 in response to the control signal CTRL. For example, the control logic 37 may adjust a voltage level provided to the word lines WL and the bit lines BL during the execution of a memory operation such as a program operation or an erase operation.

The row decoder 33 may select at least one of the plurality of memory cell blocks BLK1 to BLKn in response to the address ADDR. Further, the row decoder 33 may select at least one of the word lines WL, at least one of the string select lines SSL and at least one of the ground select lines GSL for the selected at least one of the memory cell blocks BLK1 to BLKn. Further, the row decoder 33 may transmit a voltage for performing a memory operation to the word lines WL of the selected at least one of the memory cell blocks BLK1 to BLKn.

The page buffer 35 may be connected to the memory cell array 20 through the bit lines BL. The page buffer 35 may operate as a writer driver or a sense amplifier. Specifically, during the program operation, the page buffer 35 may operate as a write driver to apply, to the bit lines BL, a voltage corresponding to the data DATA intended to be stored in the memory cell array 20. On the other hand, during the read operation, the page buffer 35 may operate as a sense amplifier to sense the data DATA stored in the memory cell array 20.

Figure 2:
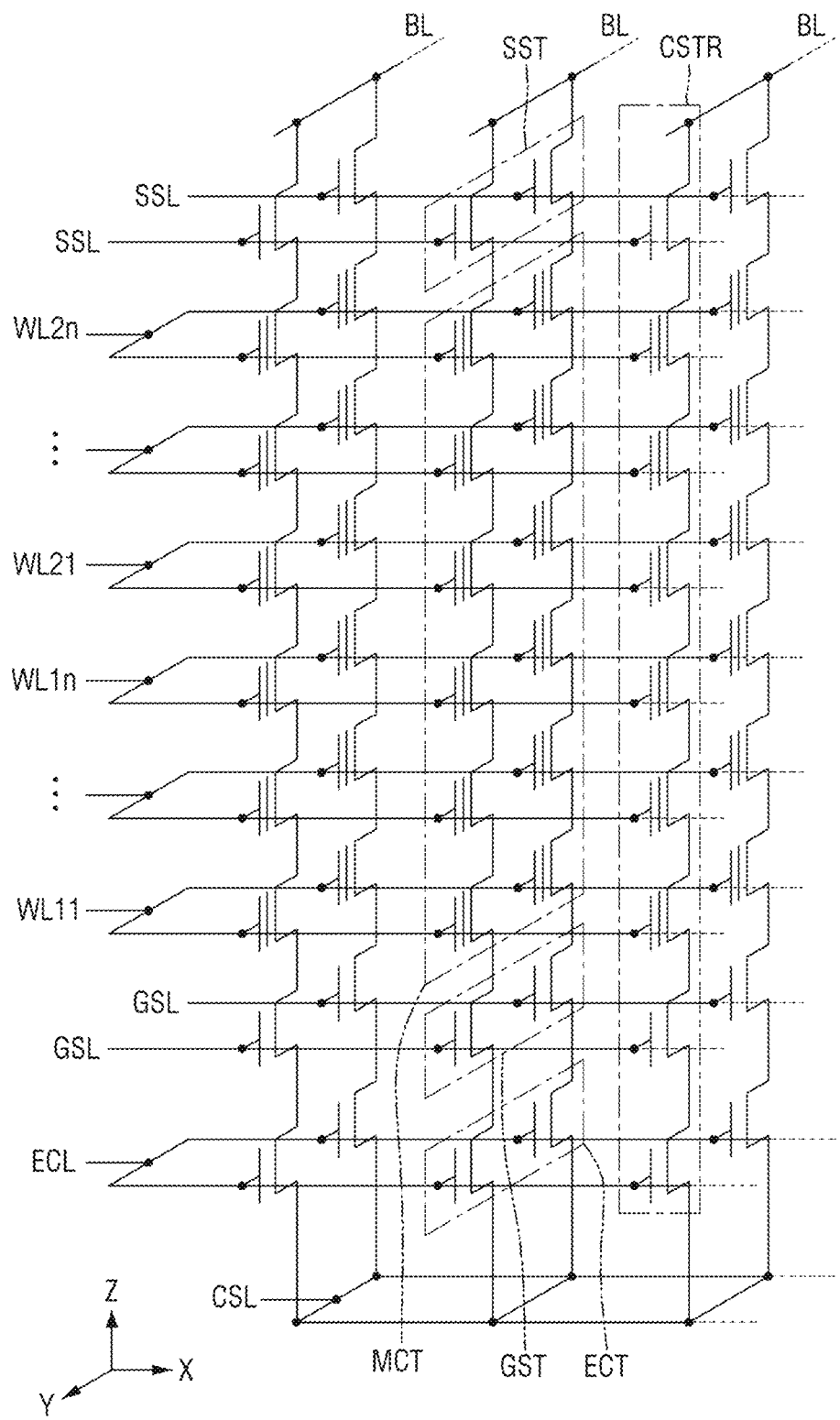
FIG. 2 is an example circuit diagram explaining a semiconductor memory device according to some embodiments.

FIG. 2 is an example circuit diagram explaining a semiconductor memory device according to some embodiments.

Referring to FIG. 2, a memory cell array (e.g., '20' in FIG. 1) of the semiconductor memory device according to some embodiments may include a common source line CSL, a plurality of bit lines BL, and a plurality of cell strings CSTR.

The common source line CSL may extend in a first direction X. In some embodiments, the plurality of common source lines CSL may be arranged two-dimensionally. For example, the plurality of common source lines CSL may extend in the first direction X while being spaced apart from each other. The same voltage may be applied to the common source lines CSL. Alternatively, different voltages may be applied to the common source lines CSL to be controlled separately.

The plurality of bit lines BL may be two-dimensionally arranged. For example, the bit lines BL may extend in the second direction Y crossing the first direction X while being spaced apart from each other. The plurality of cell strings CSTR may be connected in parallel to each of the bit lines BL. The cell strings CSTR may be commonly connected to the common source lines CSL. That is, the plurality of cell strings CSTR may be disposed between the bit lines BL and the common source lines CSL.

Each of the cell strings CSTR may include a ground select transistor GST connected to the common source line CSL, a string select transistor SST connected to the bit line BL, and a plurality of memory cell transistors MCT disposed between the ground select transistor GST and the string select transistor SST. Each of the memory cell transistors MCT may include a data storage element. The ground select transistor GST, the string select transistor SST, and the memory cell transistors MCT may be connected in series.

The common source line CSL may be commonly connected to the sources of the ground select transistors GST. Further, a ground select line GSL, a plurality of word lines WL11 to WL1n and WL21 to WL2n, and a string select line SSL may be disposed between the common source line CSL and the bit line BL. The ground select line GSL may be used as a gate electrode of the ground select transistor GST. The word lines WL11 to WL1n and WL21 to WL2n may be used as gate electrodes of the memory cell transistors MCT. The string select line SSL may be used as a gate electrode of the string select transistor SST.

In some embodiments, an erase control transistor ECT may be disposed between the common source line CSL and the ground select transistor GST. The common source line CSL may be commonly connected to sources of the erase control transistors ECT. Further, an erase control line ECL may be disposed between the common source line CSL and the ground select line GSL. The erase control line ECL may be used as a gate electrode of the erase control transistor ECT. The erase control transistors ECT may perform an erase operation of the memory cell array by generating a gate induced drain leakage (GIDL).

Figure 3:
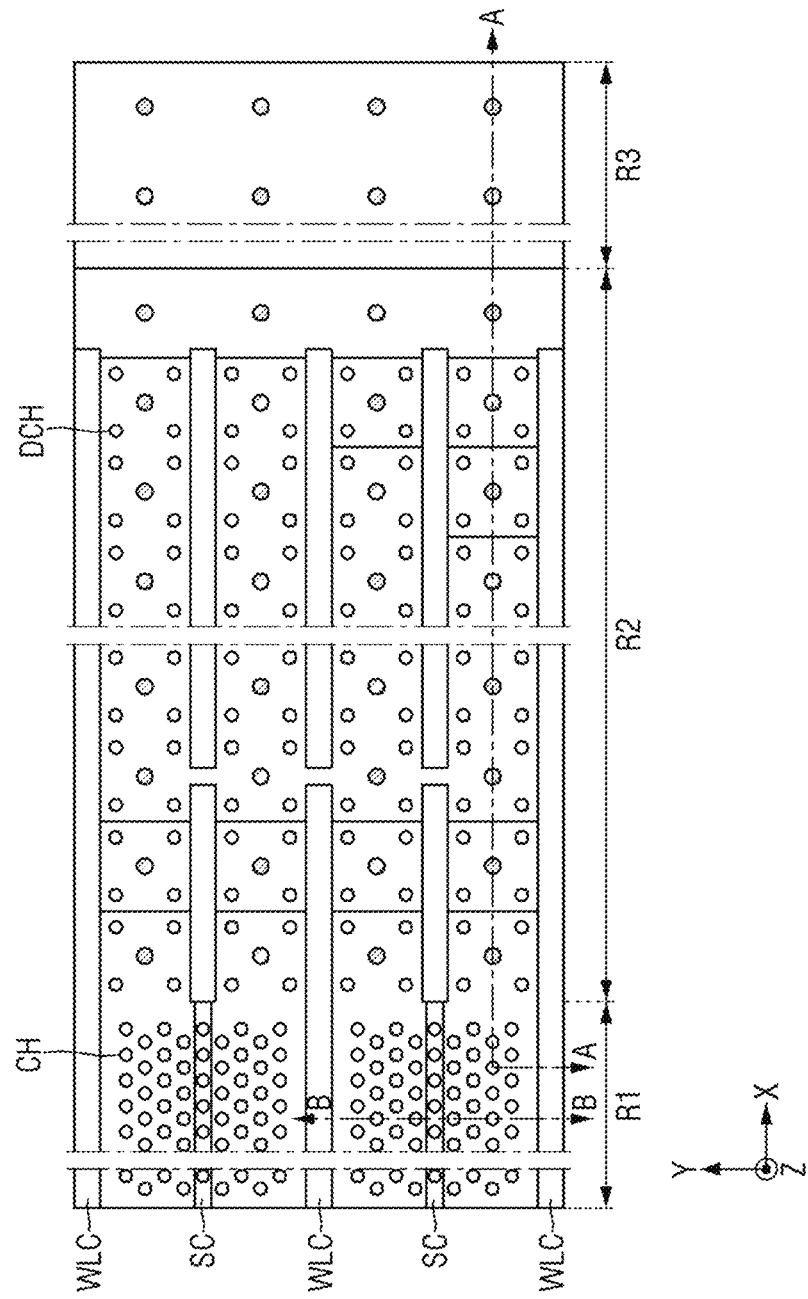
FIG. 3 is a layout diagram illustrating a semiconductor memory device according to some embodiments.
Figure 4:
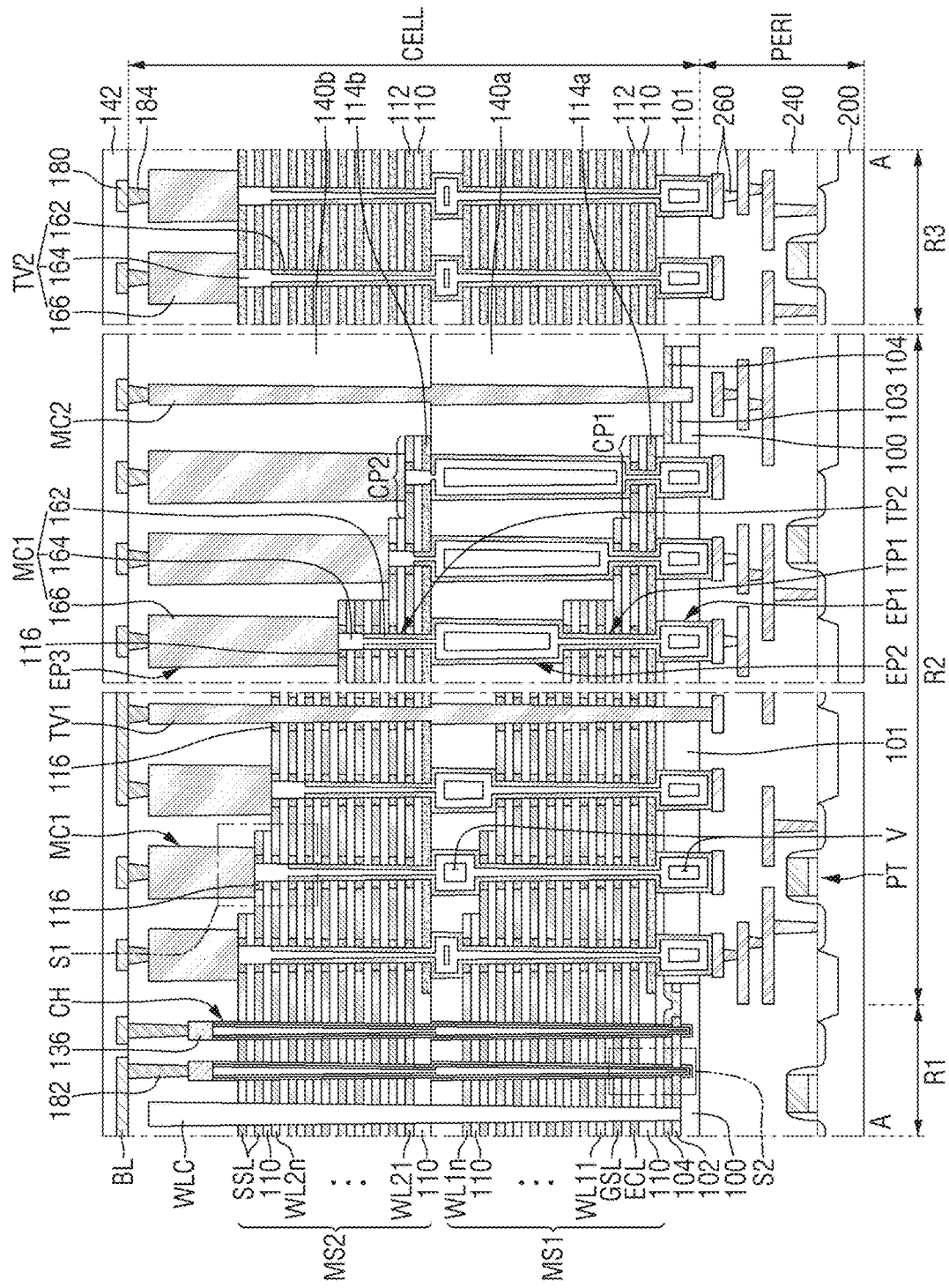
FIG. 4 is a cross-sectional view taken along line A-A of FIG. 3.
Figure 5A:
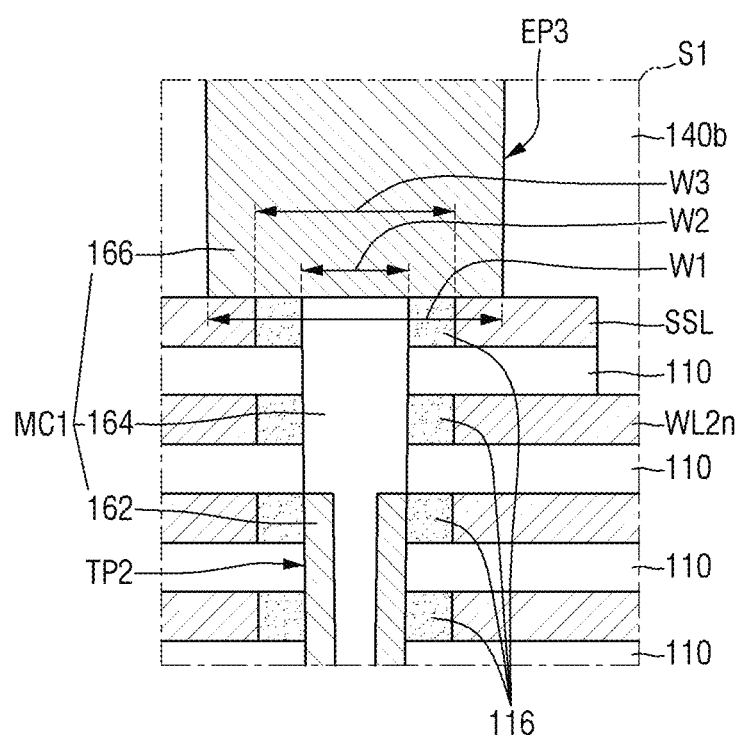
FIG. 5A is an enlarged cross-sectional view illustrating a region S1 of FIG. 4.
Figure 5B:
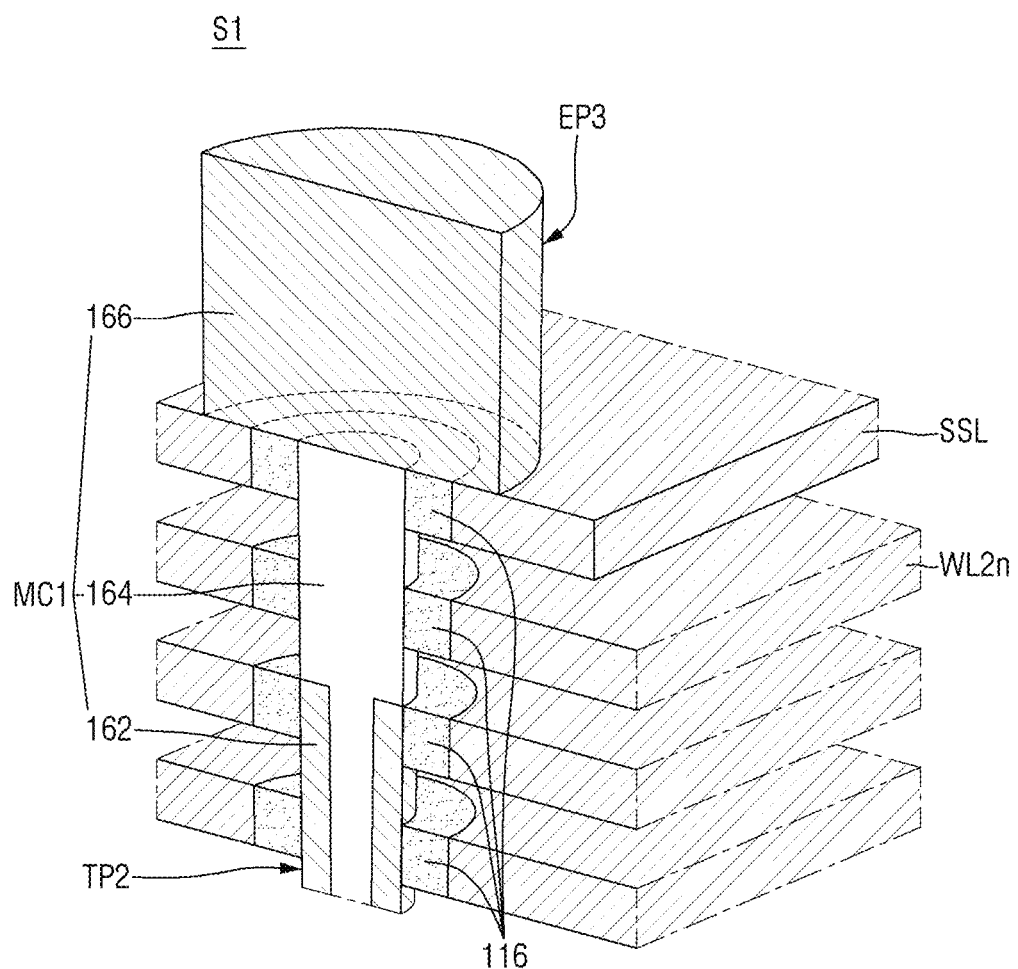
FIG. 5B is an enlarged perspective view illustrating a region S1 of FIG. 4.
Figure 6:
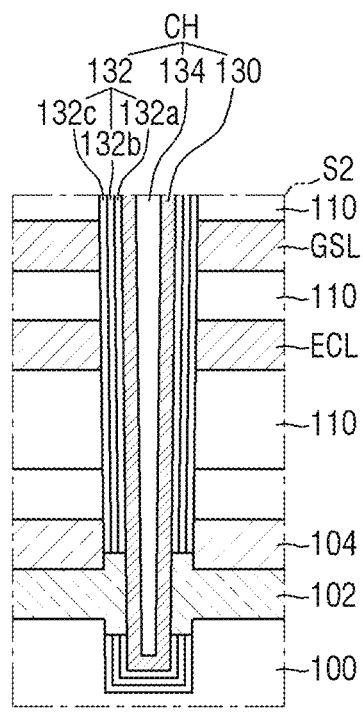
FIG. 6 is an enlarged cross-sectional view illustrating a region S2 of FIG. 3.
Figure 7:
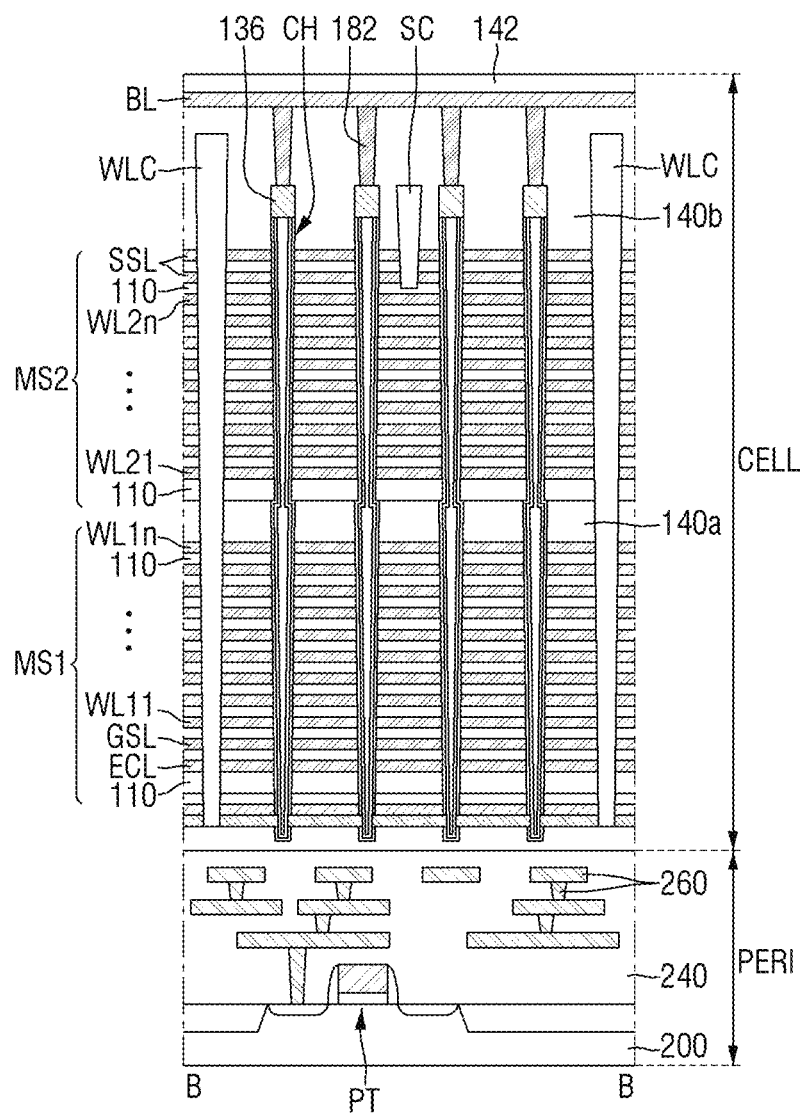
FIG. 7 is a cross-sectional view taken along lines B-B of FIG. 3.

FIG. 3 is an example layout diagram illustrating a semiconductor memory device according to some embodiments. FIG. 4 is a cross-sectional view taken along line A-A of FIG. 3. FIG. 5A is an enlarged cross-sectional view illustrating region S1 of FIG. 4. FIG. 5B is an enlarged perspective view illustrating region S1 of FIG. 4. FIG. 6 is an enlarged cross-sectional view illustrating region S2 of FIG. 3. FIG. 7 is a cross-sectional view taken along line B-B of FIG. 3.

Referring to FIGS. 3 to 7, a semiconductor memory device according to some embodiments includes a memory cell region CELL and a peripheral circuit region PERI.

The memory cell region CELL may include a cell substrate 100, an insulating substrate 101, a first mold structure MS1, a first interlayer insulating layer 140a, a second mold structure MS2, a second interlayer insulating layer 140b, a channel structure CH, a block separation area WLC, the bit line BL, a cell contact structure MC1, a first stopper layer 114a, a second stopper layer 114b, an insulating ring 116, a substrate contact structure MC2, a first through via structure TV1, a second through via structure TV2, a first wiring structure 180, and a first inter-wiring insulating layer 142.

The cell substrate 100 may include, for example, a semiconductor substrate such as a silicon substrate, a germanium substrate, or a silicon-germanium substrate. Alternatively, the cell substrate 100 may include a silicon-on-insulator (SOI) substrate or a germanium-on-insulator (GOI) substrate. In some embodiments, the cell substrate 100 may include impurities. For example, the cell substrate 100 may include n-type impurities (e.g., phosphorus (P), arsenic (As), or the like).

The cell substrate 100 may include a cell array region R1 and an extension region R2.

A memory cell array (e.g., '20' in FIG. 1) including a plurality of memory cells may be formed in the cell array region R1. For example, the channel structure CH, the bit line BL, gate electrodes ECL, GSL, WL11 to WL1n, WL21 to WL2n, and SSL, and the like, which will be described later, may be disposed in the cell array region R1. In the following description, a surface of the cell substrate 100, on which the memory cell array is disposed, may be referred to as a front surface of the cell substrate 100. On the contrary, a surface of the cell substrate 100 opposite to the front surface of the cell substrate 100 may be referred to as a rear surface of the cell substrate 100.

The extension region R2 may be disposed around the cell array region R1. The gate electrodes ECL, GSL, WL11 to WL1n, WL21 to WL2n, and SSL, which will be described later, may be stacked in a stepwise manner in the extension region R2.

In some embodiments, the cell substrate 100 may further include a through region R3. The through region R3 may be disposed inside the cell array region R1 and the extension region R2, or may be disposed outside the cell array region R1 and the extension region R2. A first through via structure TV1 or a second through via structure TV2, which will be described later, may be disposed in the through region R3.

The insulating substrate 101 may be formed in the cell substrate 100 of the extension region R2. The insulating substrate 101 may form an insulating region in the cell substrate 100 of the extension region R2. The insulating substrate 101 may include, for example, at least one of silicon oxide, silicon nitride, silicon oxynitride and silicon carbide, but is not limited thereto. In some embodiments, the insulating substrate 101 may be formed in the cell substrate 100 of the through region R3.

Although it is illustrated that the bottom surface of the insulating substrate 101 is coplanar with the bottom surface of the cell substrate 100, this is only an example. As another example, the bottom surface of the insulating substrate 101 may be lower than the bottom surface of the cell substrate 100.

The first mold structure MS1 may be formed on the front surface (e.g., the upper surface) of the cell substrate 100. The first mold structure MS1 may include a plurality of first gate electrodes ECL, GSL, and WL11 to WL1$n$, and a plurality of mold insulating layers 110 that are alternately stacked on the cell substrate 100. The first gate electrodes ECL, GSL, and WL11 to WL1$n$ and the mold insulating layers 110 may have a layered structure in which each of the first gate electrodes ECL, GSL, and WL11 to WL1$n$ and each of the mold insulating layers 110 extend parallel to the upper surface of the cell substrate 100. The first gate electrodes ECL, GSL, and WL11 to WL1$n$ may be sequentially stacked on the cell substrate 100 while being spaced apart from each other by the mold insulating layers 110.

The first gate electrodes ECL, GSL, and WL11 to WL1$n$ may be stacked in a stepwise manner in the extension region R2. For example, the first gate electrodes ECL, GSL, and WL11 to WL1$n$ may extend at different lengths in the first direction X to have a stepped portion. In some embodiments, the first gate electrodes ECL, GSL, and WL11 to WL1$n$ may have a stepped portion in the second direction Y. Accordingly, each of the first gate electrodes ECL, GSL, and WL11 to WL1$n$ may include a first pad region CP1 exposed by other first gate electrodes.

In some embodiments, the first gate electrodes ECL, GSL, and WL11 to WL1$n$ may include the erase control line ECL, the ground select line GSL, and the plurality of first word lines WL11 to WL1$n$ sequentially stacked on the cell substrate 100. In some other embodiments, the erase control line ECL may be omitted.

The first interlayer insulating layer 140$a$ may be formed on the cell substrate 100. The first interlayer insulating layer 140$a$ may cover the first mold structure MS1. The first interlayer insulating layer 140$a$ may include, for example, at least one of silicon oxide, silicon oxynitride, or a low-k material having a lower dielectric constant than silicon oxide, but is not limited thereto.

The second mold structure MS2 may be formed on the first mold structure MS1 and the first interlayer insulating layer 140$a$. The second mold structure MS2 may include a plurality of second gate electrodes WL21 to WL2$n$, and SSL and a plurality of mold insulating layers 110 that are alternately stacked on the first mold structure MS1 and the first interlayer insulating layer 140$a$. The second gate electrodes WL21 to WL2$n$ and SSL and the mold insulating layers 110 may have a layered structure, in which each of the second gate electrodes WL21 to WL2$n$ and SSL and each of the mold insulating layers 110 extend parallel to the upper surface of the cell substrate 100. The second gate electrodes WL21 to WL2$n$ and SSL may be sequentially stacked on the first mold structure MS1 and the first interlayer insulating layer 140$a$ while being spaced apart from each other by the mold insulating layers 110.

Similar to the first gate electrodes ECL, GSL, and WL11 to WL1$n$, the second gate electrodes WL21 to WL2$n$ and SSL may be stacked in a stepwise manner in the extension region R2. Accordingly, each of the second gate electrodes WL21 to WL2$n$ and SSL may include a second pad region CP2 exposed by other second gate electrodes. In some embodiments, the plurality of second pad regions CP2 may be formed to overlap the plurality of first pad regions CP1 in a third direction Z.

In some embodiments, the second gate electrodes WL21 to WL2$n$ and SSL may include the plurality of second word lines WL21 to WL2$n$ and the string select line SSL sequentially stacked on the first mold structure MS1. In some embodiments, the second mold structure MS2 may include a plurality of string select lines SSL.

The second interlayer insulating layer 140$b$ may be formed on the first mold structure MS1 and the first interlayer insulating layer 140$a$. The second interlayer insulating layer 140$b$ may cover the second mold structure MS2. The second interlayer insulating layer 140$b$ may include, for example, at least one of silicon oxide, silicon oxynitride, or a low-k material having a lower dielectric constant than silicon oxide, but is not limited thereto.

Each of the gate electrodes ECL, GSL, WL11 to WL1$n$, WL21 to WL2$n$, and SSL may include a conductive material, for example, a metal such as tungsten (W), cobalt (Co), or nickel (Ni) or a semiconductor material such as silicon, but is not limited thereto. For example, each of the gate electrodes ECL, GSL, WL11 to WL1$n$, WL21 to WL2$n$, and SSL may include tungsten (W).

The mold insulating layer 110 may include an insulating material, for example, at least one of silicon oxide, silicon nitride, or silicon oxynitride, but is not limited thereto. For example, the mold insulating layer 110 may include silicon oxide.

In some embodiments, the first mold structure MS1 in the through region R3 and the second mold structure MS2 in the through region R3 may each include the plurality of mold sacrificial layers 112 and the plurality of mold insulating layers 110 that are alternately stacked on the cell substrate 100 and/or the insulating substrate 101. The mold sacrificial layers 112 and the mold insulating layers 110 may have a layered structure in which each of the mold sacrificial layers 112 and each of the mold insulating layers 110 extend parallel to the upper surface of the cell substrate 100. The mold sacrificial layers 112 may be sequentially stacked on the cell substrate 100 while being spaced apart from each other by the mold insulating layers 110.

The mold sacrificial layer 112 may include an insulating material, for example, at least one of silicon oxide, silicon nitride, or silicon oxynitride, but is not limited thereto. In some embodiments, the mold sacrificial layer 112 may include a material having an etching selectivity with respect to the mold insulating layer 110. For example, the mold insulating layer 110 may include silicon oxide, and the mold sacrificial layer 112 may include silicon nitride.

The channel structure CH may be formed in the first mold structure MS1 and the second mold structure MS2 of the cell array region R1. The channel structure CH may extend in a vertical direction (hereinafter, referred to as the third direction Z) intersecting the upper surface of the cell substrate 100 and pass through the first mold structure MS1 and the second mold structure MS2. For example, the channel structure CH may have a pillar shape (e.g., a cylindrical shape) extending in the third direction Z. Accordingly, the channel structure CH may cross each of the gate electrodes ECL, GSL, WL11 to WL1$n$, WL21 to WL2$n$, and SSL. In some embodiments, the channel structure CH may have a bent portion between the first mold structure MS1 and the second mold structure MS2. This may be due to characteristics of an etching operation for forming the channel structure CH, but is not limited thereto.

The channel structure CH may include a semiconductor pattern 130 and an information storage layer 132.

The semiconductor pattern 130 may extend in the third direction Z and pass through the first mold structure MS1 and the second mold structure MS2. The semiconductor pattern 130 is shown only in a cup shape, but this is merely example. For example, the semiconductor pattern 130 may have various shapes such as a cylindrical shape, a rectangular tube shape, and a solid pillar shape. The semiconductor pattern 130 may include, for example, a semiconductor material such as monocrystalline silicon, polycrystalline silicon, organic semiconductor material, and carbon nanostructure, but is not limited thereto.

The information storage layer 132 may be interposed between the semiconductor pattern 130 and each of the gate electrodes ECL, GSL, WL11 to WL1$n$ and WL21 to WL2$n$, and SSL. For example, the information storage layer 132 may extend along an outer side surface of the semiconductor pattern 130. The information storage layer 132 may include, for example, at least one of silicon oxide, silicon nitride, silicon oxynitride, or a high dielectric constant material having a higher dielectric constant than silicon oxide. The high dielectric constant material may include, for example, at least one selected from the group consisting of aluminum oxide, hafnium oxide, lanthanum oxide, tantalum oxide, titanium oxide, lanthanum hafnium oxide, lanthanum aluminum oxide, dysprosium scandium oxide and a combination thereof.

In some embodiments, a plurality of channel structures CH may be arranged in a zigzag shape. For example, as illustrated in FIG. 3, the plurality of channel structures CH may be alternately arranged in the first direction X and the second direction Y. The plurality of channel structures CH arranged in a zigzag shape can further improve the integration density of the semiconductor memory device. In some embodiments, the plurality of channel structures CH may be arranged in a honeycomb shape.

In some embodiments, a dummy channel structure DCH may be formed in the first mold structure MS1 and the second mold structure MS2 of the extension region R2. The dummy channel structure DCH may be formed in a shape similar to that of the channel structure CH to reduce stress applied to the first mold structure MS1 and the second mold structure MS2 in the extension region R2.

In some embodiments, the information storage layer 132 may be formed of multiple films. For example, as shown in FIG. 6, the information storage layer 132 may include a tunnel insulating layer 132$a$, a charge storage layer 132$b$, and a blocking insulating layer 132$c$ that are sequentially stacked on the outer surface of the semiconductor pattern 130.

The tunnel insulating layer 132$a$ may include, for example, silicon oxide or a high-k material (e.g., aluminum oxide ($Al_2O_3$) or hafnium oxide ($HfO_2$)) having a higher dielectric constant than silicon oxide. The charge storage layer 132$b$ may include, for example, silicon nitride. The blocking insulating layer 132$c$ may include, for example, silicon oxide or a high dielectric constant material (e.g., aluminum oxide ($Al_2O_3$) or hafnium oxide ($HfO_2$)) having a higher dielectric constant than silicon oxide.

In some embodiments, the channel structure CH may further include a filling pattern 134. The filling pattern 134 may be formed to fill an interior of the semiconductor pattern 130 having a cup shape. The filling pattern 134 may include an insulating material, e.g., silicon oxide, but is not limited thereto.

In some embodiments, the channel structure CH may further include a channel pad 136. The channel pad 136 may be formed to be connected to the semiconductor pattern 130. For example, the channel pad 136 may be formed in the second interlayer insulating layer 141 and connected to an upper portion of the semiconductor pattern 130. The channel pad 136 may include, for example, polysilicon doped with impurities, but is not limited thereto.

In some embodiments, first source structures 102 and 104 may be formed on the cell substrate 100. The first source structures 102 and 104 may be interposed between the cell substrate 100 and the first mold structure MS1. For example, the first source structures 102 and 104 may extend along the upper surface of the cell substrate 100. The first source structures 102 and 104 may be formed to be connected to the semiconductor pattern 130 of the channel structure CH. For example, as shown in FIG. 6, the first source structures 102 and 104 may pass through the information storage layer 132 to be in contact with the semiconductor pattern 130. The first source structures 102 and 104 may be provided as a common source line (e.g., 'CSL' in FIG. 2) of the semiconductor memory device. The first source structures 102 and 104 may include, for example, a metal or polysilicon doped with impurities, but are not limited thereto.

In some embodiments, the channel structure CH may pass through the first source structures 102 and 104. For example, a lower portion of the channel structure CH may pass through the first source structures 102 and 104 to be buried in the cell substrate 100.

In some embodiments, the first source structures 102 and 104 may be formed of multiple layers. For example, the first source structures 102 and 104 may include the first source layer 102 and the second source layer 104 sequentially stacked on the cell substrate 100. Each of the first source layer 102 and the second source layer 104 may include polysilicon doped with impurities or polysilicon containing no impurities, but is not limited thereto. The first source layer 102 may be in contact with the semiconductor pattern 130 and provided as a common source line (e.g., 'CSL' in FIG. 2) of the semiconductor memory device. The second source layer 104 may be used as a support layer for preventing a mold stack from falling or collapsing in a replacement operation for forming the first source layer 102.

Although not shown, a base insulating layer may be interposed between the cell substrate 100 and the first source structures 102 and 104. The base insulating layer may include, for example, at least one of silicon oxide, silicon nitride, or silicon oxynitride, but is not limited thereto.

In some embodiments, the insulating substrate 101 may pass through the first source structures 102 and 104. For example, the first source structures 102 and 104 may not be formed in the extension region R2 where the insulating substrate 101 is formed. Although it is illustrated that the upper' surface of the insulating substrate 101 is coplanar with the upper surface of the first source structures 102 and 104, this is only an example. As another example, the upper surface of the insulating substrate 101 may be higher than the upper surface of the first source structures 102 and 104.

In some embodiments, a source sacrificial layer 103 may be formed on a part of the cell substrate 100. For example, the source sacrificial layer 103 may be formed on a part of the cell substrate 100 in the extension region R2. The source sacrificial layer 103 may include a material having an etching selectivity with respect to the mold insulating layer 110. For example, the mold insulating layer 110 may include silicon oxide, and the source sacrificial layer 103 may include silicon nitride. The source sacrificial layer 103 may be a layer remaining after a part thereof is replaced with the first source layer 102 during the manufacturing process of the first source structures 102 and 104.

The block separation area WLC may extend in the first direction X and cut the first mold structure MS1 and the second mold structure MS2. The first mold structure MS1 and the second mold structure MS2 may be cut by the plurality of block separation areas WLC, thereby forming a plurality of memory cell blocks (e.g., BLK1 to BLKn in FIG. 1). For example, two adjacent block separation areas WLC may define one memory cell block therebetween. The channel structures CH may be disposed in each memory cell block defined by the block separation areas WLC.

FIG. 3 illustrates only nine channel structures CH that are arranged in a zigzag along the second direction Y in one memory cell block, but this is only an example. The number of channel structures CH disposed in each memory cell block is not limited to the illustration and may vary.

In some embodiments, the block separation area WLC may extend in the first direction X and cut the first source structures 102 and 104. Although it is illustrated that the bottom surface of the block separation area WLC is coplanar with the bottom surface of the first source structures 102 and 104, this is only an example. As another example, the bottom surface of the block separation area WLC may be lower than the bottom surface of the first source structures 102 and 104.

In some embodiments, the block separation area WLC may include an insulating material. For example, the insulating material may fill the block separation area WLC. The insulating material may include, for example, at least one of silicon oxide, silicon nitride, or silicon oxynitride, but is not limited thereto.

In some embodiments, a string separation structure SC may be formed in the second mold structure MS2. The string separation structure SC may extend in the first direction X to cut the string select line SSL. Each of the memory cell blocks defined by the block separation areas WLC may be divided by the string separation structure SC to form a plurality of string areas. For example, the string separation structure SC may define two string areas in one memory cell block.

The bit line BL may be formed on the second mold structure MS2 and the second interlayer insulating layer 140b. The bit line BL may extend in the second direction Y to cross the block separation area WLC. Further, the bit line BL may extend in the second direction Y to be connected to the plurality of channel structures CH arranged in the second direction Y. For example, a bit line contact 182, which is connected to an upper portion of each channel structure CH, may be formed in the second interlayer insulating layer 140b. The bit line BL may be electrically connected to the channel structures CH via the bit line contacts 182.

The cell contact structure MC1 may be formed in the extension region R2. The cell contact structure MC1 may extend in the third direction Z and pass through the first mold structure MS1 and the second mold structure MS2 in the extension region R2. The cell contact structure MC1 may be connected to each of the gate electrodes ECL, GSL, WL11 to WL1n, WL21 to WL2n, and SSL in the first pad region CP1 and the second pad region CP2. Specifically, the cell contact structure MC1 may include a lower conductive pattern 162, an insulating pattern 164, and an upper conductive pattern 166.

The lower conductive pattern 162 may be connected to a first gate electrode exposed in the first pad region CP1 among the first gate electrodes ECL, GSL, and WL11 to WL1n. For example, the lower conductive pattern 162 may be in contact with the upper surface of the uppermost first word line WL1n in the first pad region CP1 of the uppermost first word line WL1n. Through this, the lower conductive pattern 162 may be electrically connected to one of the first gate electrodes ECL, GSL, and WL11 to WL1n.

The upper conductive pattern 166 may be connected to a second gate electrode exposed in the second pad region CP2 among the second gate electrodes WL21 to WL2n and SSL. For example, the upper conductive pattern 166 may be in contact with the upper surface of the string select line SSL in the second pad region CP2 of the string select line SSL. Through this, the upper conductive pattern 166 may be electrically connected to one of the second gate electrodes WL21 to WL2n and SSL.

In some embodiments, a level of a first gate electrode connected to the lower conductive pattern 162 among the first gate electrodes ECL, GSL, and WL11 to WL1n may be the same as a level of a second gate electrode connected to the upper conductive pattern 166 among the second gate electrodes WL21 to WL2n and SSL. As an example, the uppermost first word line WL1n connected to the lower conductive pattern 162 may be an uppermost first gate electrode among the first gate electrodes ECL, GSL, and WL11 to WL1n. The string select line SSL connected to the upper conductive pattern 166 may be an uppermost second gate electrode among the second gate electrodes WL21 to WL2n and SSL. As another example, the erase control line ECL connected to the lower conductive pattern 162 may be a lowermost first gate electrode among the first gate electrodes ECL, GSL, and WL11 to WL1n. The lowermost second word line WL21 connected to the upper conductive pattern 166 may be a lowermost second gate electrode among the second gate electrodes WL21 to WL2n and SSL.

Each of the lower conductive pattern 162 and the upper conductive pattern 166 may contain a conductive material, for example, a metal such as tungsten (W), cobalt (Co), nickel (Ni), or a semiconductor material such as silicon, but the present disclosure is not limited thereto. For example, each of the lower conductive pattern 162 and the upper conductive pattern 166 may include tungsten (W). The lower conductive pattern 162 and the upper conductive pattern 166 may include the same material or different materials.

The insulating pattern 164 may separate the lower conductive pattern 162 and the upper conductive pattern 166 from each other. For example, at least a part of the insulating pattern 164 may be interposed between the lower conductive pattern 162 and the upper conductive pattern 166. The insulating pattern 164 may form an insulating node between the lower conductive pattern 162 and the upper conductive pattern 166 by electrically and physically separating the lower conductive pattern 162 and the upper conductive pattern 166 from each other. The insulating pattern 164 may include an insulating material, for example, at least one of silicon oxide, silicon nitride, or silicon oxynitride, but is not limited thereto. For example, the insulating pattern 164 may include silicon oxide.

Further, the cell contact structure MC1 may include first, second and third extension portions EP1, EP2, and EP3, and first and second through portions TP1 and TP2. The first extension portion EP1 may be disposed under the first mold structure MS1. The second extension portion EP2 may be disposed between the first mold structure MS1 and the second mold structure MS2. The third extension portion EP3 may be disposed on the second mold structure MS2. The first through portion TP1 may pass through the first mold structure MS1 to connect the first extension portion EP1 and the second extension portion EP2 to each other. The second through portion TP2 may pass through the second mold structure MS2 to connect the second extension portion EP2 and the third extension portion EP3 to each other.

Each of the first to third extension portions EP1 to EP3 may have a width greater than the width of each of the first and second through portions TP1 and TP2. For example, as shown in FIG. 5A, a width W1 of the third extension portion EP3 may be greater than a width W2 of the second through portion TP2.

The lower conductive pattern 162 may be disposed in the first extension portion EP1, the first through portion TP1, and the second extension portion EP2. For example, the lower conductive pattern 162 may extend along the profile of the first extension portion EP1, the first through portion TP1, and the second extension portion EP2. The second extension portion EP2 may be disposed on the first pad region CP1. Accordingly, the lower conductive pattern 162 in the second extension portion EP2 may be connected to the first gate electrode exposed in the first pad region CP1 among the first gate electrodes ECL, GSL, and WL11 to WL1n. In some embodiments, an upper portion of the lower conductive pattern 162 may further extend along a profile of a part of the second through portion TP2.

The upper conductive pattern 166 may be disposed in the third extension portion EP3. For example, the upper conductive pattern 166 may fill the third extension portion EP3. The third extension portion EP3 may be disposed on the second pad region CP2. Accordingly, the upper conductive pattern 166 in the third extension portion EP3 may be connected to the second gate electrode exposed in the second pad region CP2 among the second gate electrodes WL21 to WL2n and SSL.

At least a part of the insulating pattern 164 may be disposed in the second through portion TP2. Accordingly, the insulating pattern 164 may form the insulating node between the lower conductive pattern 162 and the upper conductive pattern 166. In some embodiments, a part of the insulating pattern 164 may be disposed in the first extension portion EP1, the first through portion TP1, and the second extension portion EP2. For example, the insulating pattern 164 may extend along the profile of the lower conductive pattern 162.

In some embodiments, each of the first extension portion EP1 and the second extension portion EP2 may include a void V. The void V may be a space remaining after the lower conductive pattern 162 and the insulating pattern 164 are filled in each of the first and second extension portions EP1 and EP2. In some other embodiments, each of the first extension portion EP1 and the second extension portion EP2 may not include the void V. For example, the insulating pattern 164 may fill a space remaining after the lower conductive pattern 162 is filled in each of the first and second extension portions EP1 and EP2.

The first stopper layer 114a may be interposed between the first mold structure MS1 and the cell substrate 100 and/or the insulating substrate 101. For example, the first stopper layer 114a may extend along the upper surface of the cell substrate 100 and/or the upper surface of the insulating substrate 101. The first stopper layer 114a may define a limit to which the first extension portion EP1 extends in the third direction Z. For example, the upper surface of the first extension portion EP1 may be defined by the upper surface of the first stopper layer 114a. The lower conductive pattern 162 in the first extension portion EP1 may be separated from the first gate electrodes ECL, GSL, and WL11 to WL1n by the first stopper layer 114a. The first through portion TP1 may pass through the first stopper layer 114a to be connected to the first extension portion EP1. In some other embodiments, the first stopper layer 114a may be omitted.

The second stopper layer 114b may be interposed between the first mold structure MS1 and the second mold structure MS2. For example, the second stopper layer 114b may extend along the upper surface of the first interlayer insulating layer 140a. The second stopper layer 114b may define a limit to which the second extension portion EP2 extends in the third direction Z. For example, the upper surface of the second extension portion EP2 may be defined by the upper surface of the second stopper layer 114b. The lower conductive pattern 162 in the second extension portion EP2 may be separated from the second gate electrodes WL21 to WL2n and SSL by the second stopper layer 114b. The second through portion TP2 may pass through the second stopper layer 114b to be connected to the second extension portion EP2 In some other embodiments, the second stopper layer 114b may be omitted.

Each of the first stopper layer 114a and the second stopper layer 114b may include, for example, at least one of silicon oxide, silicon nitride, or silicon oxynitride, but is not limited thereto. In some embodiments, the first stopper layer 114a and the second stopper layer 114b may include a material having an etching selectivity with respect to the mold insulating layer 110. For example, the mold insulating layer 110 may include silicon oxide, and each of the first stopper layer 114a and the second stopper layer 114b may include silicon nitride.

In some embodiments, the block separation area WLC may not cut the first stopper layer 114a and the second stopper layer 114b. For example, each of the first stopper layer 114a and the second stopper layer 114b may not extend to the block separation area WLC.

The insulating ring 116 may be formed in the first mold structure MS1 and the second mold structure MS2. The insulating ring 116 may be interposed between the cell contact structure MC1 and each of the first gate electrodes ECL, GSL, and WL11 to WL1n and between the cell contact structure MC1 and each of the second gate electrodes WL21 to WL2n, and SSL. For example, as shown in FIG. 5B, the insulating ring 116 may be an annular structure surrounding the cell contact structure MC1.

The width of each of the first to third extension portions EP1 to EP3 may be greater than the width of the insulating ring 116. For example, as shown in FIG. 5A, the width W1 of the third extension portion EP3 may be greater than a width W3 of the insulating ring 116. Accordingly, the lower conductive pattern 162 in the second extension portion EP2 may be connected to one of the first gate electrodes ECL, GSL, and WL11 to WL1n over the insulating ring 116. The upper conductive pattern 166 in the third extension portion EP3 may be connected to one of the second gate electrodes WL21 to WL2n and SSL over the insulating ring 116. For example, as shown in FIG. 5B, the upper conductive pattern 166 may be disposed on the insulating ring 116 in the string select line SSL and may be in contact with the upper surface of the string select line SSL. Accordingly, the upper conductive pattern 166 may be selectively connected to the second gate electrode exposed in the second pad region CP2 among the second gate electrodes WL21 to WL2n and SSL.

The insulating ring 116 may electrically separate other gate electrodes not exposed in the first pad region CP1 among the gate electrodes ECL, GSL, WL11 to WL1n, WL21 to WL2n, and SSL from the lower conductive pattern 162. For example, the insulating ring 116 may prevent the lower conductive pattern 162 connected to the uppermost first word line WL1n from being in contact with other gate electrodes (e.g., the gate electrodes ECL, GSL, WL11, WL21 to WL2n, SSL, and the like) except the uppermost first word line WL1n. Accordingly, the lower conductive pattern 162 may be selectively connected to the first gate electrode exposed in the first pad region CP1 among the first gate electrodes ECL, GSL, and WL11 to WL1n.

The substrate contact structure MC2 may be connected to the cell substrate 100. For example, the substrate contact structure MC2 may extend in the third direction Z and pass through the first interlayer insulating layer 140a and the second interlayer insulating layer 140b in the extension region R2. In some embodiments, a lower portion of the substrate contact structure MC2 may pass through the first source structures 102 and 104 to be buried in the cell substrate 100. In some embodiments, the substrate contact structure MC2 may have a bent portion between the first mold structure MS1 and the second mold structure MS2. This may be due to characteristics of an etching operation for forming the substrate contact structure MC2, but is not limited thereto.

The first through via structure TV1 may pass through the first mold structure MS1 and the second mold structure MS2. Although the first through via structure TV1 is illustrated as being disposed only in the extension region R2, this is merely example. As another example, the first through via structure TV1 may be disposed in the cell array region R1 and/or the through region R3. In some embodiments, the first through via structure TV1 may have a bent portion between the first mold structure MS1 and the second mold structure MS2. This may be due to characteristics of an etching operation for forming the first through via structure TV1, but is not limited thereto. In some embodiments, the first through via structure TV1 may be formed at the same level as that of the substrate contact structure MC2. The term "the same level" as used herein means being formed by the same manufacturing process.

In some embodiments, the insulating ring 116 may be interposed between the first through via structure TV1 and each of the first gate electrodes ECL, GSL, and WL11 to WL1n and between the first through via structure TV1 and each of the second gate electrodes WL21 to WL2n, and SSL. For example, the insulating ring 116 may be an annular structure surrounding the first through via structure TV1. The first through via structure TV1 may be electrically separated from the gate electrodes ECL, GSL, WL11 to WL1n, WL21 to WL2n, and SSL by the insulating ring 116.

The second through via structure TV2 may extend in the third direction Z to pass through the first mold structure MS1 and the second mold structure MS2 in the through region R3. Accordingly, the second through via structure TV2 may cross each of the mold insulating layers 110 and each of the mold sacrificial layers 112. In some embodiments, the second through via structure TV2 may be formed at the same level as the first through via structure TV1. For example, the second through via structure TV2 may include the lower conductive pattern 162, the insulating pattern 164, and the upper conductive pattern 166 described above with regard to the cell contact structure MC1.

Each of the cell contact structure MC1, the substrate contact structure MC2, the first through via structure TV1, and the second through via structure TV2 may be connected to the first wiring structure 180 on the second interlayer insulating layer 140b. For example, a first inter-wiring insulating layer 142 may be formed on the second interlayer insulating layer 140b. The first wiring structure 180 may be formed in the first inter-wiring insulating layer 142 and connected to the cell contact structure MC1, the substrate contact structure MC2, the first through via structure TV1, and the second through via structure TV2. The first wiring structure 180 may be connected to the bit line BL.

The peripheral circuit region PERI may include a peripheral circuit board 200, a peripheral circuit element PT, a second wiring structure 260, and a second inter-wiring insulating layer 240.

The peripheral circuit board 200 may be disposed under the cell substrate 100. For example, the upper surface of the peripheral circuit board 200 may face the bottom surface of the cell substrate 100. The peripheral circuit board 200 may include, for example, a semiconductor substrate such as a silicon substrate, a germanium substrate, or a silicon-germanium substrate. Alternatively, the peripheral circuit board 200 may include a silicon-on-insulator (SOI) substrate or a germanium-on-insulator (GOI) substrate.

The peripheral circuit element PT may be formed on the peripheral circuit board 200. The peripheral circuit element PT may constitute a peripheral circuit (e.g., '30' in FIG. 1) that controls the operation of the semiconductor memory device. For example, the peripheral circuit element PT may include a control logic (e.g., '37' in FIG. 1), a row decoder (e.g., '33' in FIG. 1), and a page buffer (e.g., '35' in FIG. 1). In the following description, a surface of the peripheral circuit board 200, on which the peripheral circuit element PT is disposed, may be referred to as a front surface of the peripheral circuit board 200. On the contrary, a surface of the peripheral circuit board 200, which is opposite to the front surface of the peripheral circuit board 200, may be referred to as a rear surface of the peripheral circuit board 200.

The peripheral circuit element PT may include, for example, a transistor, but is not limited thereto. For example, the peripheral circuit element PT may include various active elements such as a transistor, as well as various passive elements such as a capacitor, a resistor, and an inductor.

In some embodiments, the rear surface of the cell substrate 100 may face the front surface of the peripheral circuit board 200. For example, the second inter-wiring insulating layer 240 covering the peripheral circuit element PT may be formed on the front surface of the peripheral circuit board 200. The cell substrate 100 and/or the insulating substrate 101 may be stacked on the upper surface of the second inter-wiring insulating layer 240.

The first wiring structure 180 may be connected to the peripheral circuit element PT via the first through via structure TV1 and/or the second through via structure TV2. For example, the second wiring structure 260 may be formed in the second inter-wiring insulating layer 240 to be connected to the peripheral circuit element PT. Each of the first through via structure TV1 and the second through via structure TV2 may pass through the first mold structure MS1 and the second mold structure MS2 to connect the first wiring structure 180 and the second wiring structure 260 to each other. Through this, the bit line BL, each of the gate electrodes ECL, GSL, WL11 to WL1n, WL21 to WL2n, and SSL, and/or the first source structures 102 and 104 may be electrically connected to the peripheral circuit element PT.

In some embodiments, each of the first through via structure TV1 and the second through via structure TV2 may pass through the insulating substrate 101 to connect the first wiring structure 180 and the second wiring structure 260 to each other. Accordingly, the first through via structure TV1 and the second through via structure TV2 may be electrically separated from the cell substrate 100.

In some embodiments, the upper conductive pattern 166 of the cell contact structure MC1 may be connected to the peripheral circuit element PT via the first through via structure TV1 and/or the second through via structure TV2. For example, the upper conductive pattern 166 may be connected to the first wiring structure 180.

For high integration of a semiconductor memory device, a multi-stack including a plurality of mold structures (e.g., the first mold structure MS1 and the second mold structure MS2) may be formed. However, the multi-stack has a drawback in that as the number of layered stacks increases, the size of a space (e.g., the extension region R2) required to form a contact also increases.

However, in the semiconductor memory device according to some embodiments, it is possible to remarkably reduce the size of the space (e.g., the extension region R2) required to form a contact using the cell contact structure MC1 that is formed to overlap the extension region R2 of a lower stack (e.g., the first mold structure MS1) and the extension region R2 of an upper stack (e.g., the second mold structure MS2). Specifically, as described above, the cell contact structure MC1 may pass through the first mold structure MS1 and the second mold structure MS2 in the extension region R2. In this case, the lower conductive pattern 162 of the cell contact structure MC1 may be connected to each of the first gate electrodes ECL, GSL, and WL11 to WL1$n$ of the first mold structure MS1, and the upper conductive pattern 166 of the cell contact structure MC1 may be connected to each of the second gate electrodes WL21 to WL2$n$ and SSL of the second mold structure MS2. Further, the lower conductive pattern 162 and the upper conductive pattern 166 may be electrically separated from each other by the insulating pattern 164 of the cell contact structure MC1. Through this, the first mold structure MS1 and the second mold structure MS2 may share the extension region R2. For example, the level of the first gate electrode, which is connected to the lower conductive pattern 162 among the first gate electrodes ECL, GSL, and WL11 to WL1$n$, may be the same as the level of the second gate electrode which is connected to the upper conductive pattern 166 among the second gate electrodes WL21 to WL2$n$ and SSL. Accordingly, it is possible to provide a semiconductor memory device that facilitates miniaturization of a product by remarkably reducing the size of the space required to form a contact.

Figure 8A:
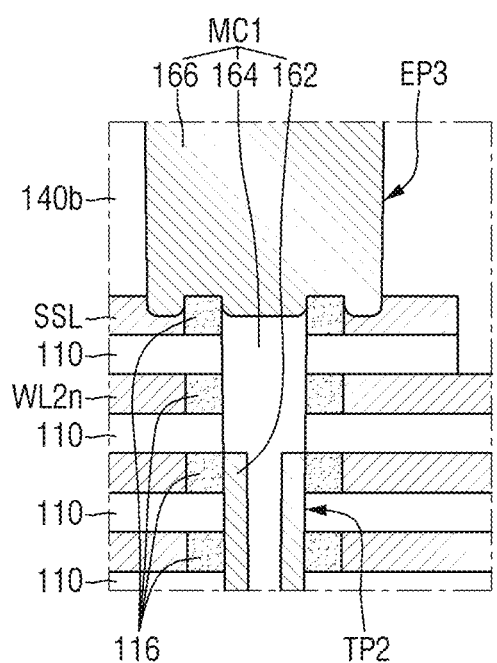
FIGS. 8A and 8B are various other enlarged cross-sectional views illustrating a region S1 of FIG. 4.
Figure 8B:
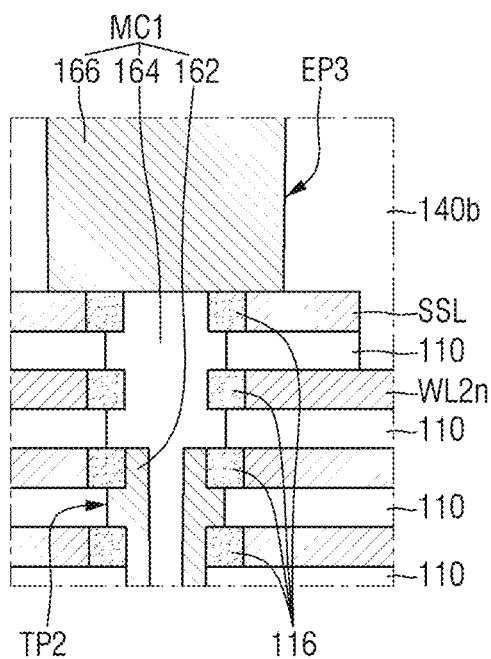

FIGS. 8A and 8B are various other enlarged cross-sectional views for explaining region S1 of FIG. 4. For simplicity of description, redundant parts of the description made with reference to FIGS. 1 to 7 may be recapitulated or omitted.

Referring to FIG. 8A, in the semiconductor memory device according to some embodiments, the upper surface of the second gate electrode, which is connected to the upper conductive pattern 166 among the second gate electrodes WL21 to WL2$n$ and SSL, includes a recess.

For example, as illustrated, the upper surface of the string select line SSL connected to the upper conductive pattern 166 may include a concave recess. This may be due to characteristics of an etching process for forming the cell contact structure MC1.

In some embodiments, the upper surface of the insulating pattern 164 may include a concave recess. Although the depth of the recessed insulating pattern 164 is illustrated as being the same as that of the recessed second gate electrode (e.g., the string select line SSL), this is only an example. The depth of the recessed insulating pattern 164 may be less or greater than the depth of the recessed second gate electrode (e.g., the string select line SSL) according to characteristics of an etching operation.

Referring to FIG. 8B, in the semiconductor memory device according to some embodiments, the mold insulating layers 110 adjacent to the cell contact structure MC1 include a recess.

For example, as illustrated, the width of the second through portion TP2 may be greater than the width of the inner surface of the insulating ring 116. Accordingly, each of the lower conductive pattern 162 and the insulating pattern 164 may include a protrusion protruding toward the mold insulating layer 110.

The width of the second through portion TP2 may be less than the width of the outer surface of the insulating ring 116. Accordingly, the insulating pattern 164 may isolate other gate electrodes, which are not exposed in the first pad region CP1 among the gate electrodes ECL, GSL, WL11 to WL1$n$, WL21 to WL2$n$, and SSL, from the lower conductive pattern 162.

Figure 9:
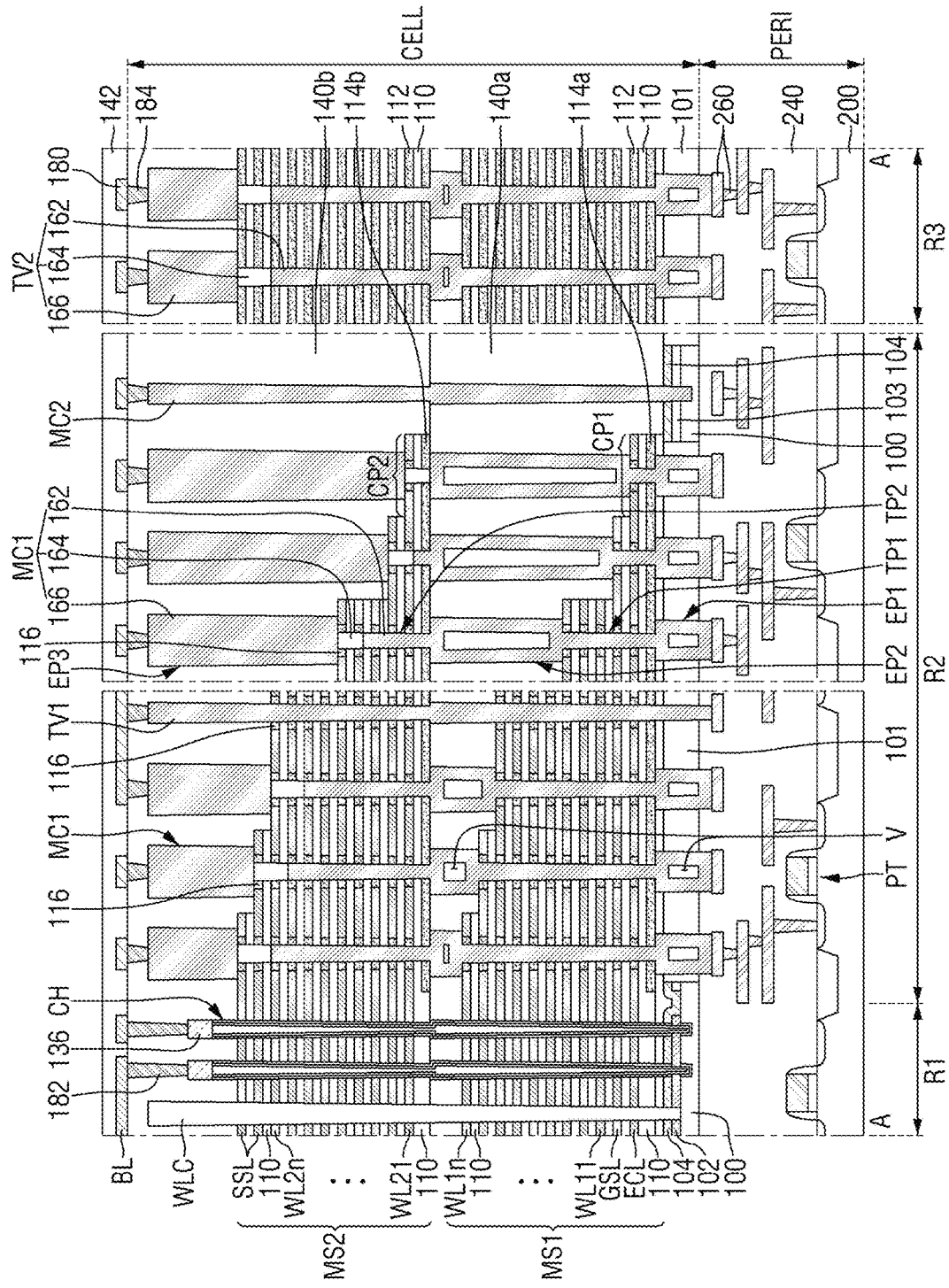
FIG. 9 is a cross-sectional view illustrating a semiconductor memory device according to some embodiments.

FIG. 9 is a cross-sectional view illustrating a semiconductor memory device according to some embodiments. For simplicity of description, redundant parts of the description made with reference to FIGS. 1 to 7 may be recapitulated or omitted.

Referring to FIG. 9, in the semiconductor memory device according to some embodiments, the lower conductive pattern 162 fills the first through portion TP1 and the second through portion TP2.

For example, the lower conductive pattern 162 of FIG. 9 may be formed to be thicker than the lower conductive pattern 162 of FIG. 4. In this case, the insulating pattern 164 may not be disposed in the first extension portion EP1, the first through portion TP1, and the second extension portion EP2. For example, the insulating pattern 164 may be disposed in the second through portion TP2 to cover the upper surface of the lower conductive pattern 162.

In some embodiments, each of the first extension portion EP1 and the second extension portion EP2 may include the void V. The void V may be a space remaining after the lower conductive pattern 162 is filled in each of the first extension portion EP1 and the second extension portion EP2. In some other embodiments, each of the first extension portion EP1 and the second extension portion EP2 may not include the void V. For example, the lower conductive pattern 162 may fill each of first extension portion EP1 and the second extension portion EP2.

Figure 10:
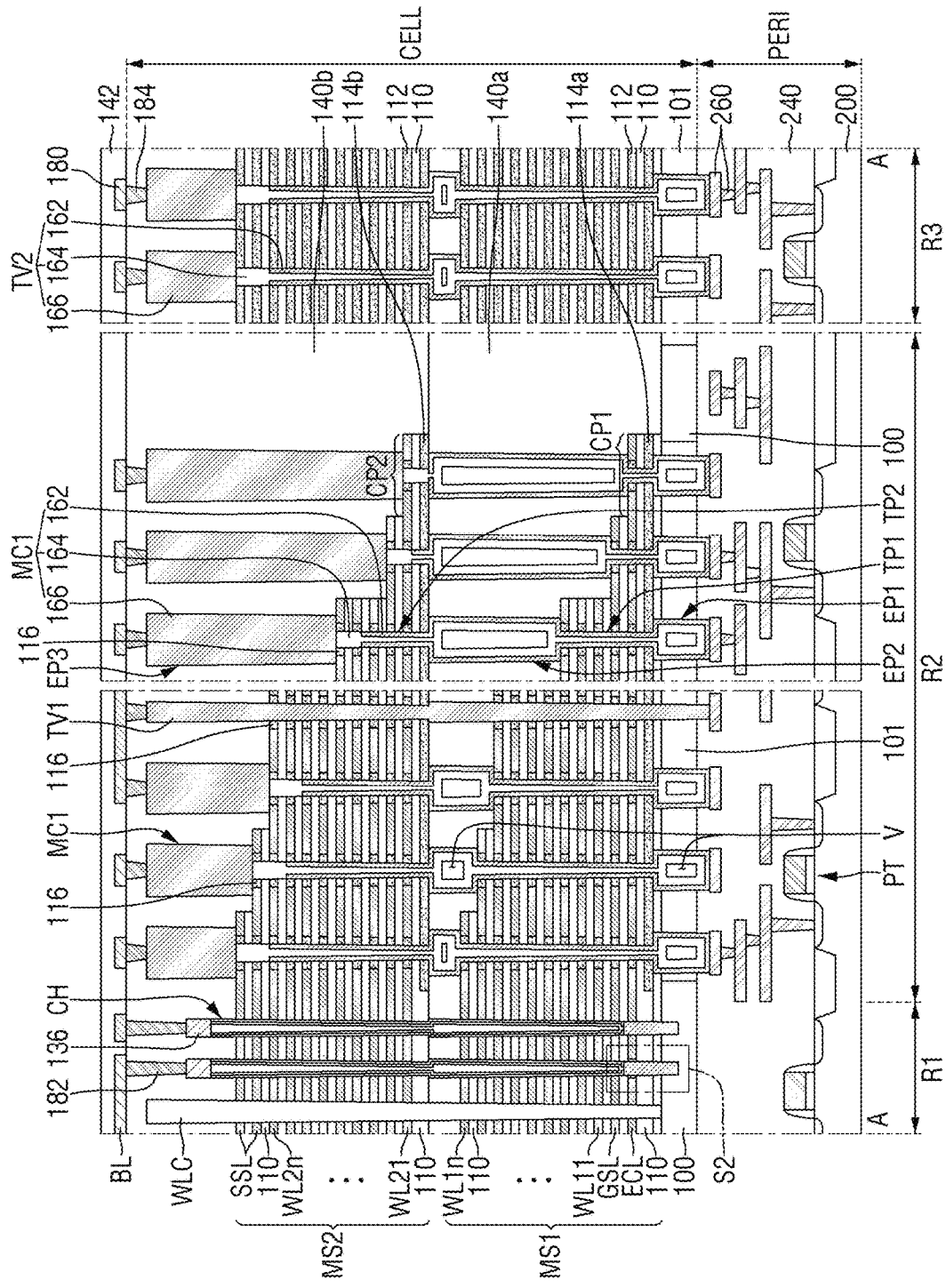
FIG. 10 is a cross-sectional view illustrating a semiconductor memory device according to some embodiments
Figure 11:
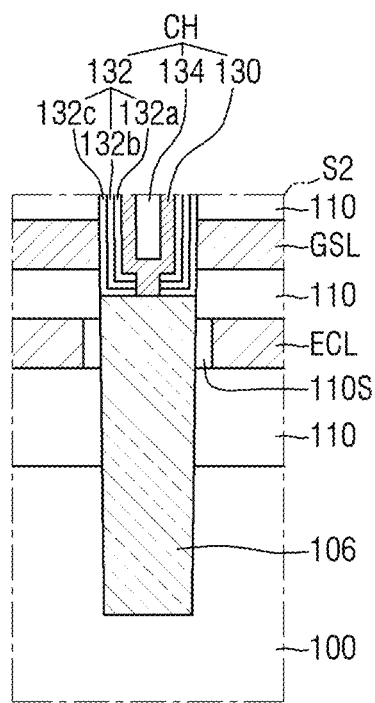
FIG. 11 is an enlarged cross-sectional view illustrating a region S2 of FIG. 10.

FIG. 10 is a cross-sectional view illustrating a semiconductor memory device according to some embodiments. FIG. 11 is an enlarged cross-sectional view illustrating region S2 of FIG. 10. For simplicity of description, redundant parts of the description made with reference to FIGS. 1 to 7 may be recapitulated or omitted.

Referring to FIGS. 10 and 11, a semiconductor memory device according to some embodiments includes a second source structure 106.

The second source structure 106 may be formed on the cell substrate 100. A lower portion of the second source structure 106 is illustrated as being buried in the cell substrate 100, but this is only an example. The second source structure 106 may be connected to the semiconductor pattern 130 of the channel structure CH. For example, the semiconductor pattern 130 may pass through the information storage layer 132 to be in contact with the upper surface of the second source structure 106. The second source structure 106 may be formed, for example, from the cell substrate 100 through a selective epitaxial growth operation, but is not limited thereto.

In some embodiments, the upper surface of the second source structure 106 may cross some of the gate electrodes ECL, GSL, WL11 to WL1n, WL21 to WL2n, and SSL. For example, the upper surface of the second source structure 106 may be formed to be higher than the upper surface of the erase control line ECL. In this case, a gate insulating layer 110S may be interposed between the second source structure 106 and a gate electrode (e.g., the erase control line ECL) crossing the second source structure 106.

Figure 12:
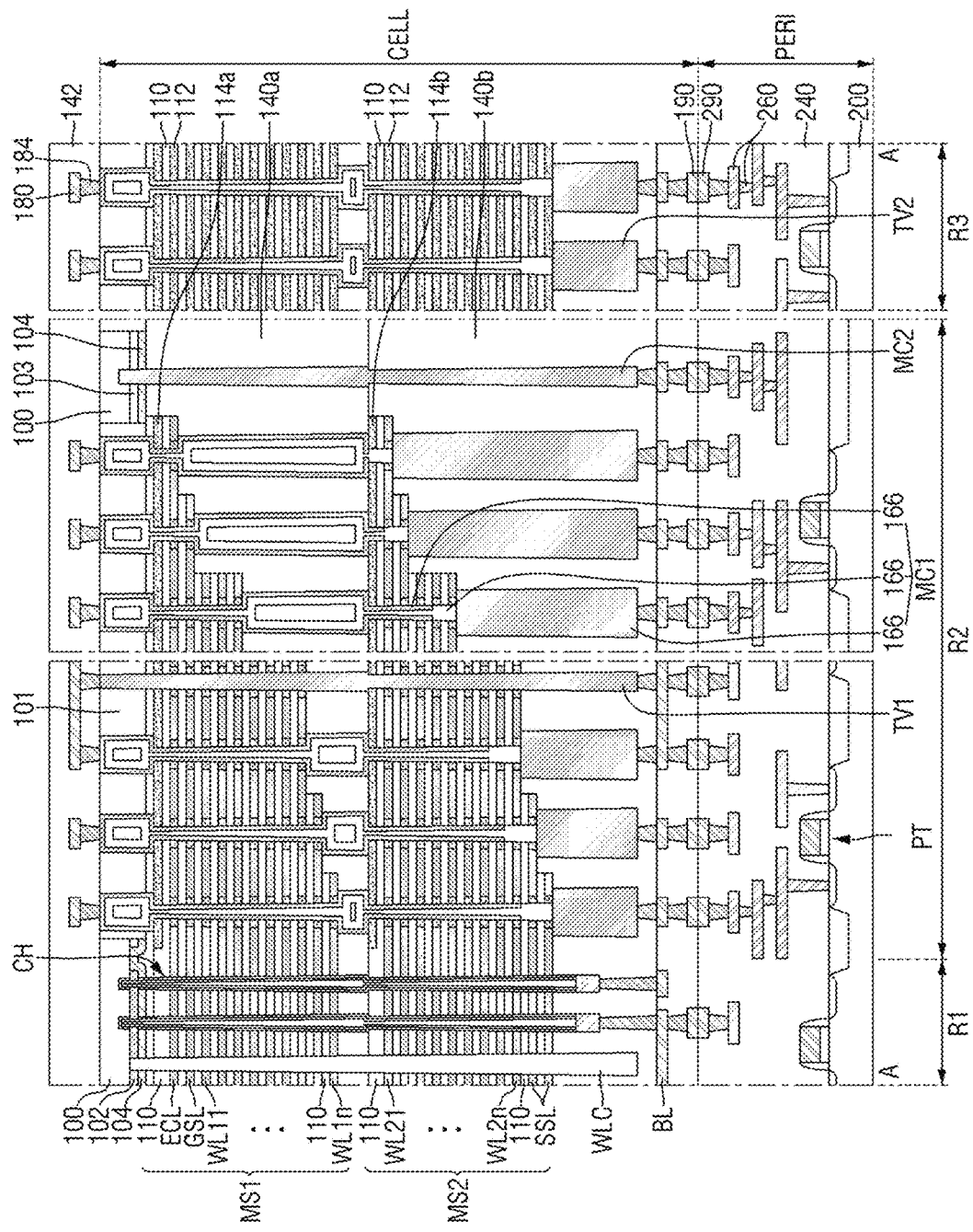
FIG. 12 is a cross-sectional view illustrating a semiconductor memory device according to some embodiments.

FIG. 12 is a cross-sectional view illustrating a semiconductor memory device according to some embodiments. For simplicity of description, redundant parts of the description made with reference to FIGS. 1 to 7 may be recapitulated or omitted.

Referring to FIG. 12, in the semiconductor memory device according to some embodiments, the front surface of the cell substrate 100 is opposite to the front surface of the peripheral circuit board 200.

For example, the semiconductor memory device according to some embodiments may have a chip to chip (C2C) structure. The C2C structure may be formed by manufacturing an upper chip including the memory cell region CELL on a first wafer (e.g., the cell substrate 100), manufacturing a lower chip including the peripheral circuit region PERI on a second wafer (e.g., the peripheral circuit board 200) different from the first wafer, and then connecting the upper chip to the lower chip by a bonding method.

For example, the bonding method may refer to a method of electrically connecting a first bonding metal 190 formed at an uppermost metal layer of the upper chip and a second bonding metal 290 formed at an uppermost metal layer of the lower chip to each other. For example, when the first bonding metal 190 and the second bonding metal 290 are formed of copper (Cu), the bonding method may be a Cu—Cu bonding method. However, this is only an example, and the first bonding metal 190 and the second bonding metal 290 may be formed of various other metals such as aluminum (Al) or tungsten (W).

As the first bonding metal 190 and the second bonding metal 290 are connected to each other, the first wiring structure 180 may be connected to the second wiring structure 260. Through this, each of the gate electrodes ECL, GSL, WL11 to WL1n, WL21 to WL2n, and SSL and/or the first source structures 102 and 104 may be electrically connected to the peripheral circuit element PT.

Figure 13:
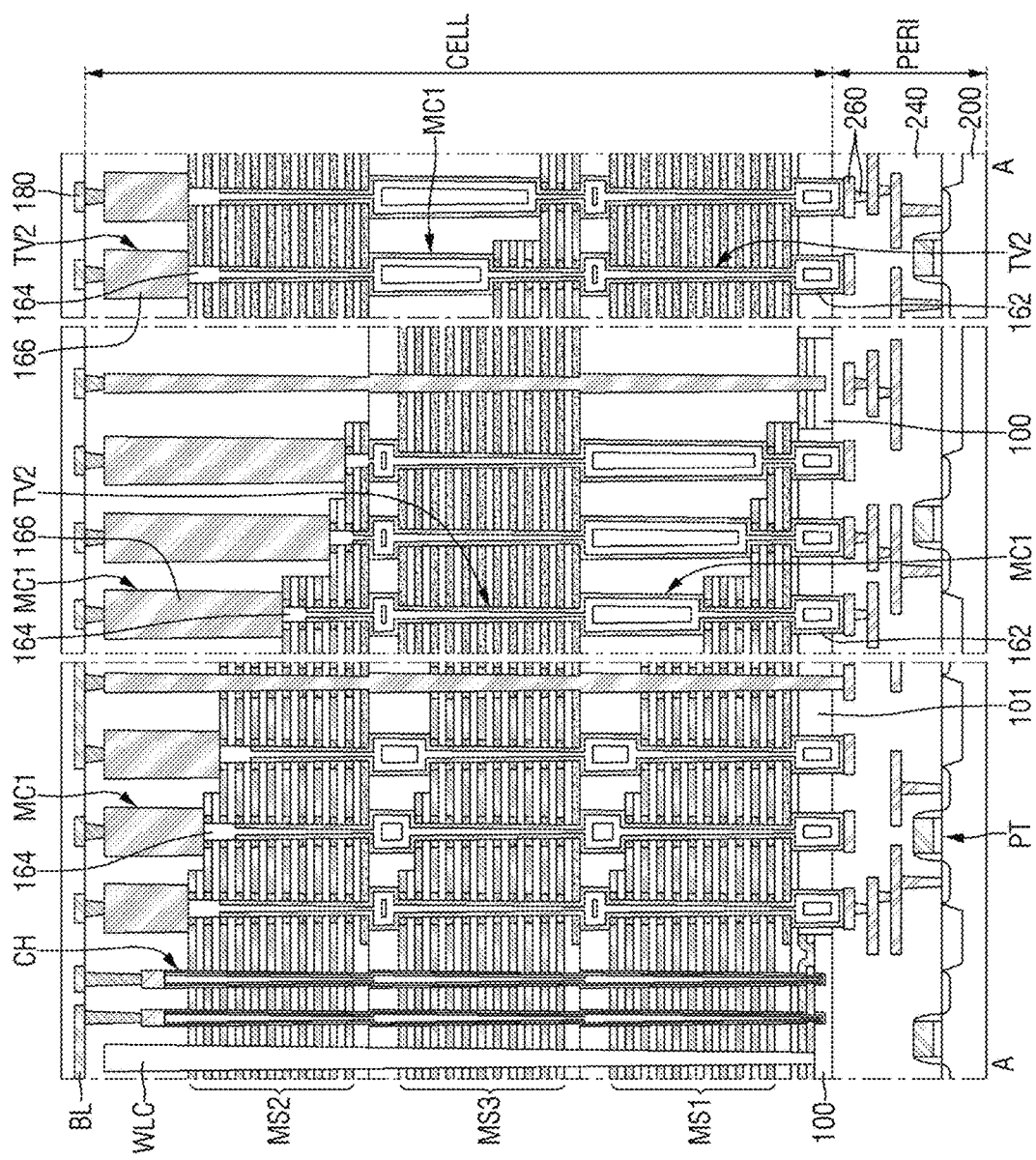
FIG. 13 is a cross-sectional view illustrating a semiconductor memory device according to some embodiments.

FIG. 13 is a cross-sectional view illustrating a semiconductor memory device according to some embodiments. For simplicity of description, redundant parts of the description made with reference to FIGS. 1 to 7 may be recapitulated or omitted.

Referring to FIG. 13, the semiconductor memory device according to some embodiments further includes a third mold structure MS3.

The third mold structure MS3 may be interposed between the first mold structure MS1 and the second mold structure MS2. For example, the third mold structure MS3 may be stacked on the first mold structure MS1, and the second mold structure MS2 may be stacked on the third mold structure MS3.

The lower conductive pattern 162 may pass through the third mold structure MS3 to be connected to each of the gate electrodes (e.g., the first gate electrodes ECL, GSL, and WL11 to WL1n in FIG. 4) of the first mold structure MS1. For example, the second through via structure TV2 may pass through the third mold structure MS3 in the extension region R2. The lower conductive pattern 162 may extend along the cell contact structure MC1 passing through the first mold structure MS1 and the second through via structure TV2 passing through the third mold structure MS3.

The upper conductive pattern 166 may be connected to each of the gate electrodes (e.g., the second gate electrodes WL21 to WL2n and SSL in FIG. 4) of the second mold structure MS2. The insulating pattern 164 may form an insulating node between the lower conductive pattern 162 and the upper conductive pattern 166.

Although the third mold structure MS3 has been described as being interposed between the first mold structure MS1 and the second mold structure MS2, the technical spirit of the present disclosure is not limited thereto. As another example, the third mold structure MS3 may be stacked on the second mold structure MS2. As still another example, the third mold structure MS3 may be stacked both on the second mold structure MS2 and between the first mold structure MS1 and the second mold structure MS2. Through this, it is possible to form a multi-stack including the mold structures that share the extension region R2.

Hereinafter, a method for fabricating a semiconductor memory device according to some example embodiments will be described with reference to FIGS. 1 to 35.

FIGS. 14 to 35 are views illustrating intermediate operations for explaining a method for fabricating a semiconductor memory device according to some embodiments. For simplicity of description, redundant parts of the description made with reference to FIGS. 1 to 13 may be recapitulated or omitted.

Figure 14:
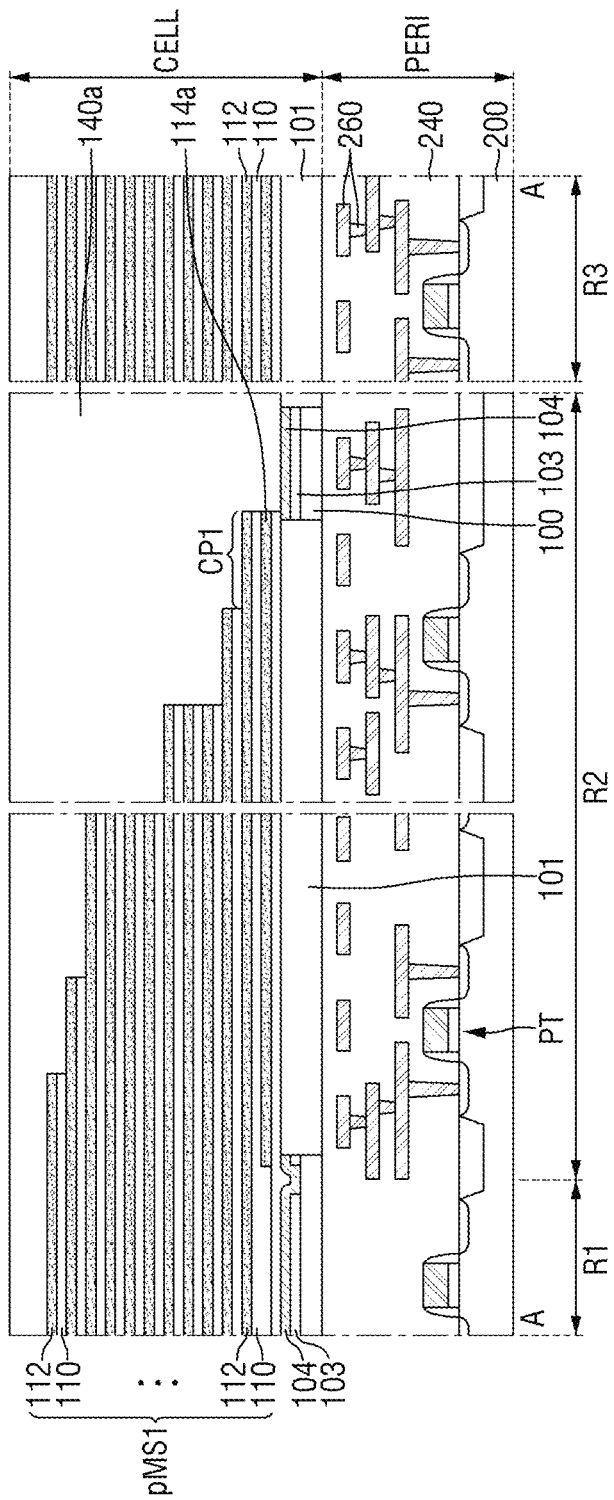
FIGS. 14 to 35 are views illustrating the intermediate operations for explaining a method for fabricating a semiconductor memory device according to some embodiments.

Referring to FIG. 14, a first preliminary mold pMS1 and the first interlayer insulating layer 140a are formed on the cell substrate 100 and/or the insulating substrate 101.

The first preliminary mold pMS1 may be formed on the front surface of the cell substrate 100. The first preliminary mold pMS1 may include the mold sacrificial layers 112 and the mold insulating layers 110 that are alternately stacked on the cell substrate 100. The mold sacrificial layers 112 may be stacked in the stepwise manner in the extension region R2. For example, the first preliminary mold pMS1 in the extension region R2 may be patterned in the stepwise manner. Accordingly, each of the mold sacrificial layers 112 of the first preliminary mold pMS1 may include the first pad region CP1 exposed by other mold sacrificial layers 112. In some embodiments, the first preliminary mold pMS1 in the through region R3 may not be patterned. Subsequently, the first interlayer insulating layer 140a may be formed to cover the first preliminary mold pMS1.

The mold sacrificial layer 112 may include a material having an etching selectivity with respect to the mold insulating layer 110. For example, the mold insulating layer 110 may include silicon oxide, and the mold sacrificial layer 112 may include silicon nitride.

The cell substrate 100 and/or the insulating substrate 101 may be stacked on the peripheral circuit region PERI. For example, the peripheral circuit element PT, the second wiring structure 260, and the second inter-wiring insulating layer 240 may be formed on the peripheral circuit board 200. The cell substrate 100 and/or the insulating substrate 101 may be stacked on the second inter-wiring insulating layer 240.

In some embodiments, before forming the first preliminary mold pMS1, the source sacrificial layer 103 and the second source layer 104 may be formed on the cell substrate 100. The source sacrificial layer 103 may include a material having an etching selectivity with respect to the mold insulating layer 110. The second source layer 104 may include polysilicon doped with impurities or polysilicon containing no impurities, but is not limited thereto.

In some embodiments, before forming the first preliminary mold pMS1, the first stopper layer 114a may be formed on the cell substrate 100 and/or the insulating substrate 101. The first stopper layer 114a may include a material having an etching selectivity with respect to the mold insulating layer 110. For example, the mold insulating layer 110 may include silicon oxide, and the first stopper layer 114a may include silicon nitride.

Figure 15:
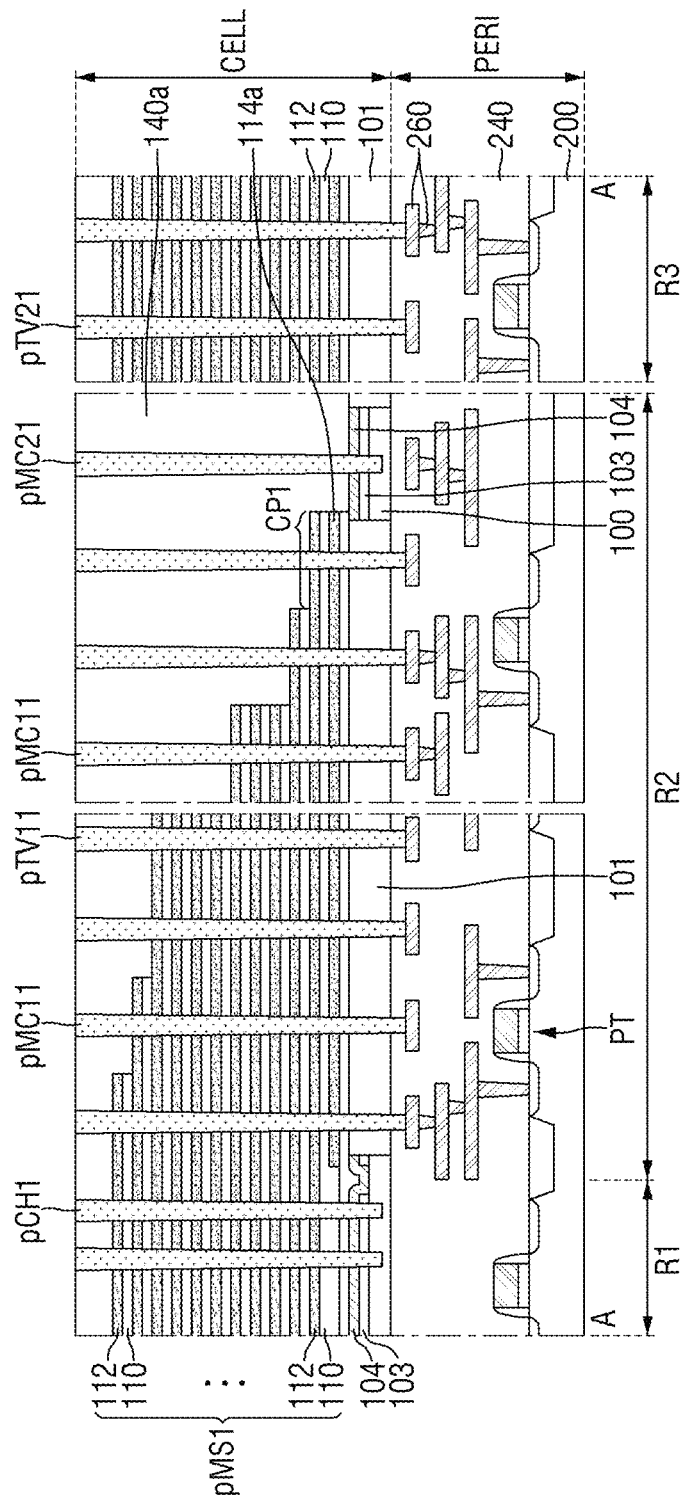

Referring to FIG. 15, a first preliminary channel pCH1, a first preliminary cell contact pMC11, a first preliminary substrate contact pMC21, a first preliminary through via pTV11 and a second preliminary through via pTV21 are formed.

The first preliminary channel pCH1 may pass through the first preliminary mold pMS1 in the cell array region R1. In some embodiments, the first preliminary channel pCH1 may pass through the source sacrificial layer 103 and the second source layer 104 to be connected to the cell substrate 100.

Each of the first preliminary cell contact pMC11 and the first preliminary through via pTV11 may pass through the first preliminary mold pMS1 in the extension region R2. The second preliminary through via pTV21 may pass through the first preliminary mold pMS1 in the through region R3. Each of the first preliminary cell contact pMC11, the first preliminary through via pTV11, and the second preliminary through via pTV21 may pass through the cell substrate 100 or the insulating substrate 101 to be connected to the second wiring structure 260.

The first preliminary substrate contact pMC21 may pass through the first interlayer insulating layer 140a and the second interlayer insulating layer 140b in the extension region R2. In some embodiments, the first preliminary substrate contact pMC21 may pass through the source sacrificial layer 103 and the second source layer 104 to be connected to the cell substrate 100.

Each of the first preliminary channel pCH1, the first preliminary cell contact pMC11, the first preliminary substrate contact pMC21, the first preliminary through via pTV11, and the second preliminary through via pTV21 may include a material having an etching selectivity with respect to the first mold insulating layer 110 and the first mold sacrificial layer 112. For example, each of the first preliminary channel pCH1, the first preliminary cell contact pMC11, the first preliminary substrate contact pMC21, the first preliminary through via pTV11, and the second preliminary through via pTV21 may include polysilicon (poly-Si).

Figure 16:
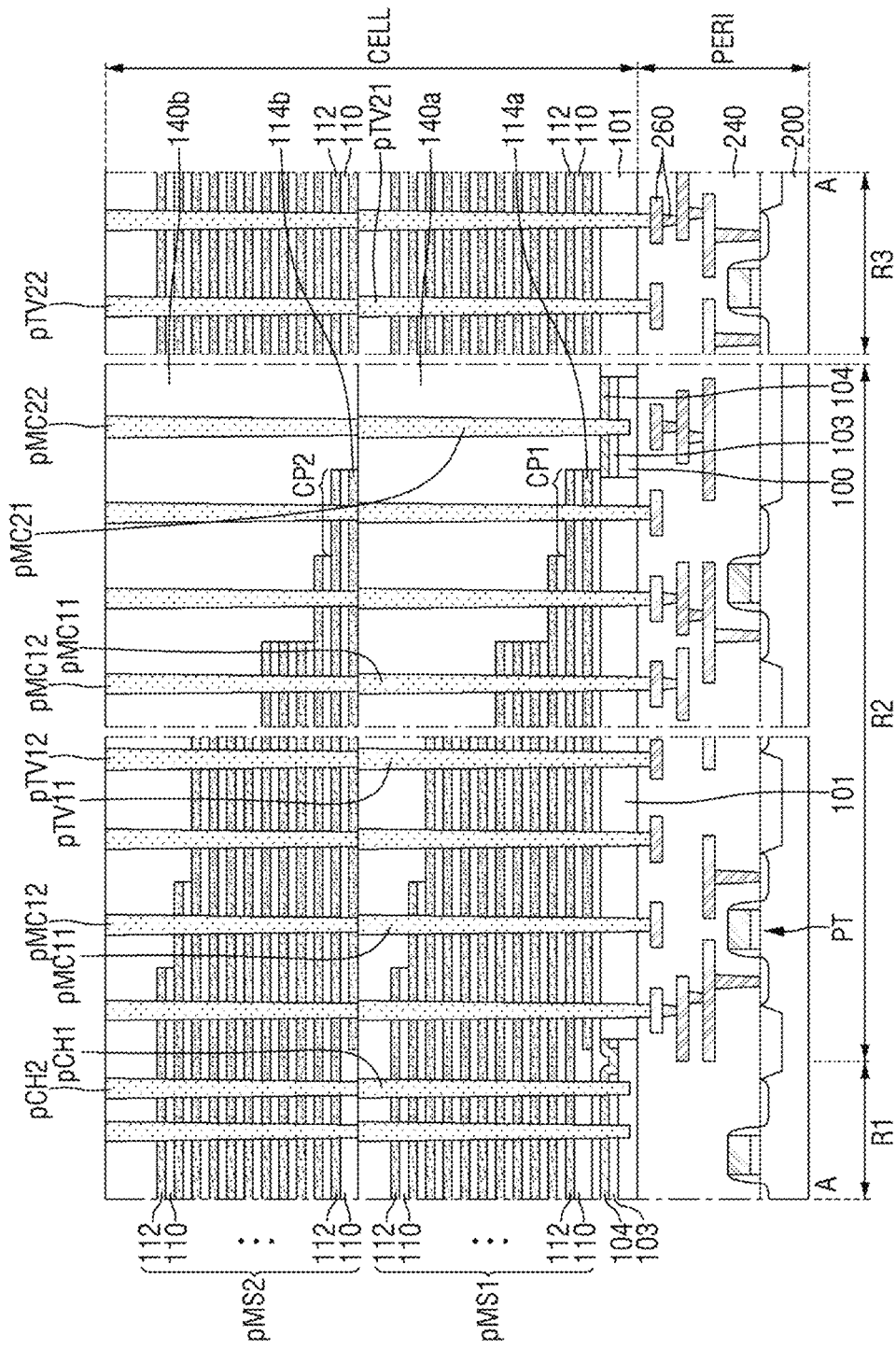

Referring to FIG. 16, a second preliminary mold pMS2, the second interlayer insulating layer 140b, a second preliminary channel pCH2, a second preliminary cell contact pMC12, a second preliminary substrate contact pMC22, a third preliminary through via pTV12, and a fourth preliminary through via pTV22 are formed.

Forming the second preliminary mold pMS2 and the second interlayer insulating layer 140b is similar to forming the first preliminary mold pMS1 and the first interlayer insulating layer 140a, and thus a detailed description thereof will be omitted below. Accordingly, the second preliminary mold pMS2 may include the mold sacrificial layers 112 and the mold insulating layers 110 that are alternately stacked on the cell substrate 100. Further, each of the mold sacrificial layers 112 of the second preliminary mold pMS2 may include the second pad region CP2 exposed by other mold sacrificial layers 112.

Forming the second preliminary channel pCH2, the second preliminary cell contact pMC12, the second preliminary substrate contact pMC22, the third preliminary through via pTV12, and the fourth preliminary through via pTV22 is similar to forming the first preliminary channel pCH1, the first preliminary cell contact pMC11, the first preliminary substrate contact pMC21, the first preliminary through via pTV11, and the second preliminary through via pTV21, and thus a detailed description thereof will be omitted. The second preliminary channel pCH2, the second preliminary cell contact pMC12, the second preliminary substrate contact pMC22, the third preliminary through via pTV12, and the fourth preliminary through via pTV22 may be connected the first preliminary channel pCH1, the first preliminary cell contact pMC11, the first preliminary substrate contact pMC21, the first preliminary through via pTV11, and the second preliminary through via pTV21, respectively.

In some embodiments, before forming the second preliminary mold pMS2, the second stopper layer 114b may be formed on the first preliminary mold pMS1. The second stopper layer 114b may include a material having an etching selectivity with respect to the mold insulating layer 110. For example, the mold insulating layer 110 may include silicon oxide, and the second stopper layer 114b may include silicon nitride.

Figure 17:
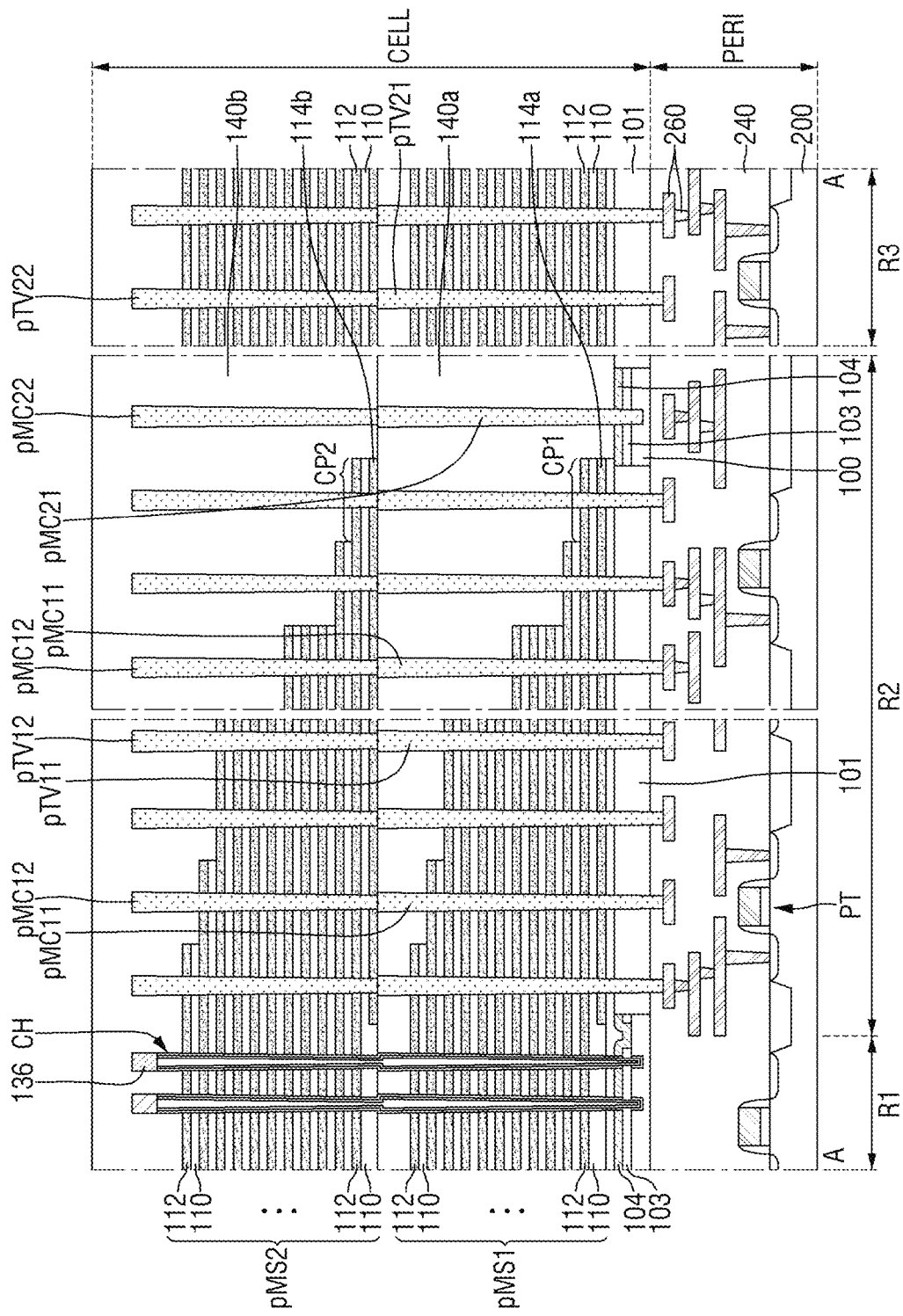

Referring to FIG. 17, the channel structure CH is formed.

For example, the first preliminary channel pCH1 and the second preliminary channel pCH2 may be removed. Subsequently, the channel structure CH replacing the region, from which the first preliminary channel pCH1 and the second preliminary channel pCH2 have been removed, may be formed. Through this, the channel structure CH may be formed in the cell array region R1 to pass through the first preliminary mold pMS1 and the second preliminary mold pMS2.

Figure 18:
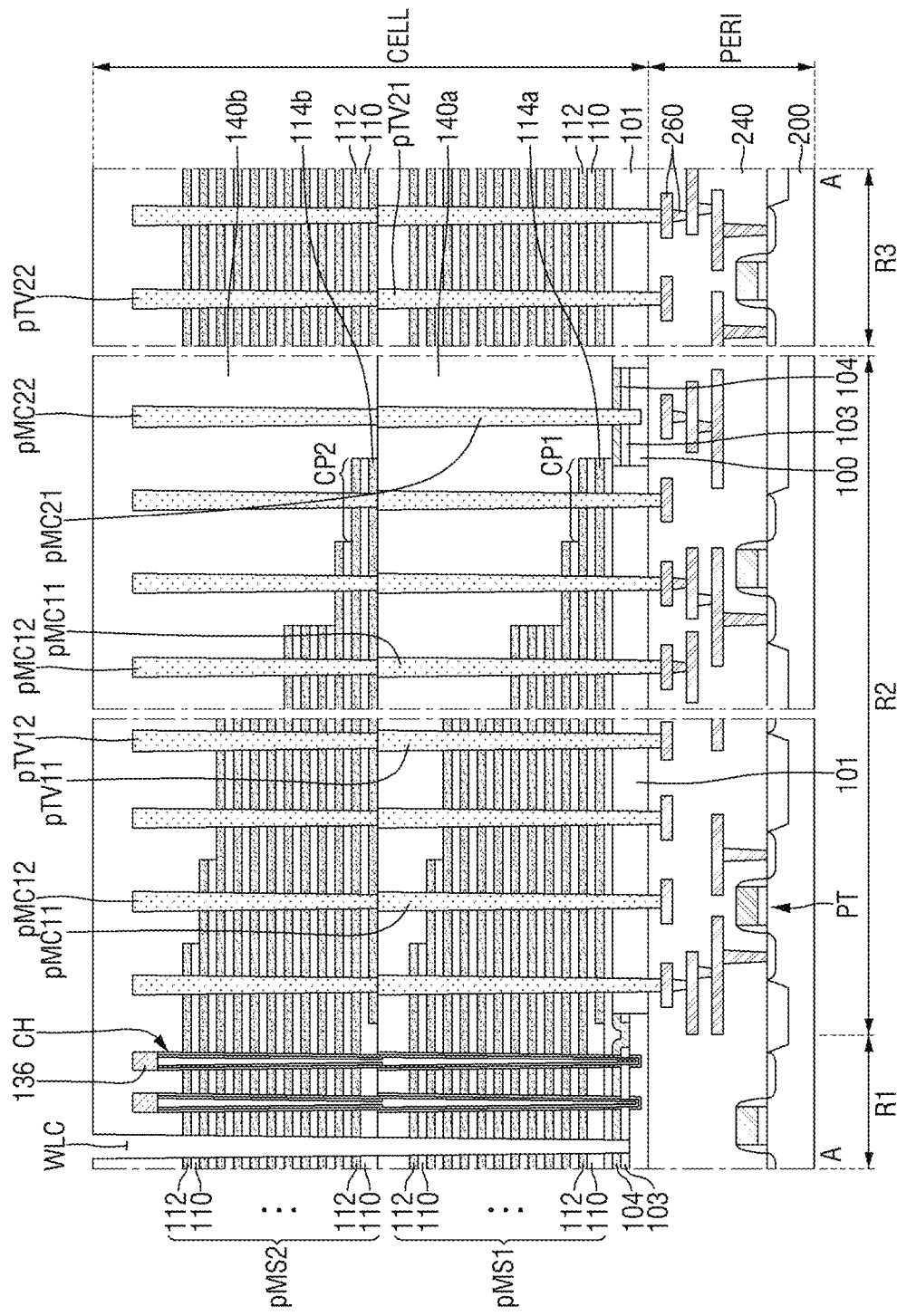

Referring to FIG. 18, the block separation area WLC is formed.

The block separation area WLC may extend in the first direction (e.g., 'X' in FIG. 3) to cut the first preliminary mold pMS1 and the second preliminary mold pMS2. In some embodiments, the block separation area WLC may not cut the first stopper layer 114a and the second stopper layer 114b.

Figure 19:
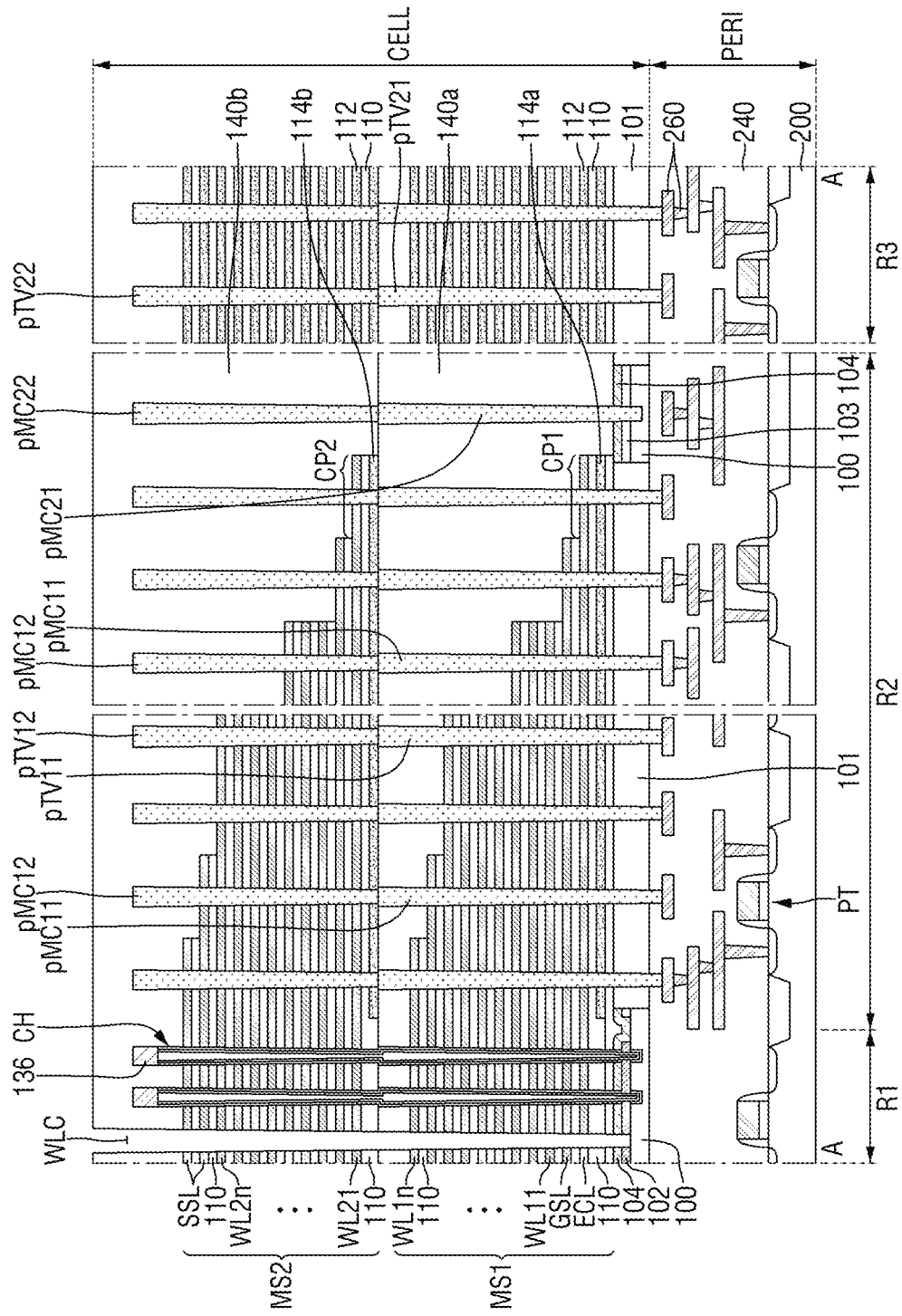

Referring to FIG. 19, the plurality of gate electrodes ECL, GSL, WL11 to WL1n, WL21 to WL2n, and SSL are formed.

For example, the mold sacrificial layers 112 may be removed using the block separation area WLC. Since the mold sacrificial layers 112 have an etching selectivity with respect to the mold insulating layers 110, they may be selectively removed. Subsequently, the gate electrodes ECL, GSL, WL11 to WL1n, WL21 to WL2n, and SSL may be formed to replace the region from which the mold sacrificial layers 112 have been removed. Through this, the first mold structure MS1 including the plurality of first gate electrodes ECL, GSL, and WL11 to WL1n and the second mold structure MS2 including the plurality of second gate electrodes WL21 to WL2n, and SSL may be formed. After the first and second mold structures MS1 and MS2 are formed, the block separation area WLC may be filled with an insulating material.

In some embodiments, since the block separation area WLC may not cut the first stopper layer 114a and the second stopper layer 114b, the first stopper layer 114a and the second stopper layer 114b may not be replaced. Further, in some embodiments, the mold sacrificial layers 112 in the through region R3 may not be replaced.

Figure 20:
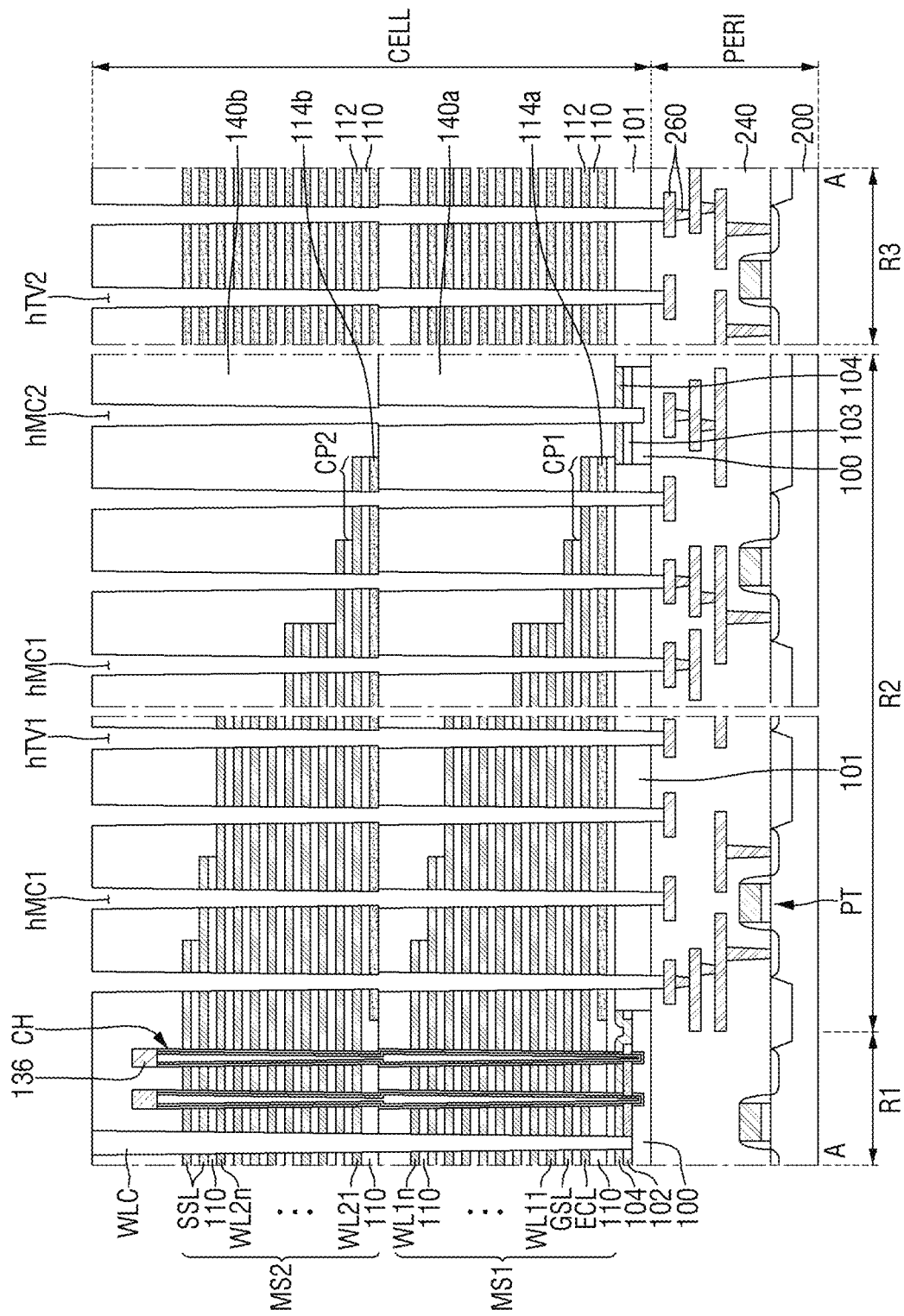

Referring to FIG. 20, a cell contact hole hMC1, a substrate contact hole hMC2, a first through via hole hTV1, and a second through via hole hTV2 are formed.

For example, the first preliminary cell contact pMC11, the first preliminary substrate contact pMC21, the first preliminary through via pTV11, the second preliminary through via pTV21, the second preliminary cell contact pMC12, the second preliminary substrate contact pMC22, the third preliminary through via pTV12, and the fourth preliminary through via pTV22 may be selectively removed.

Figure 21:
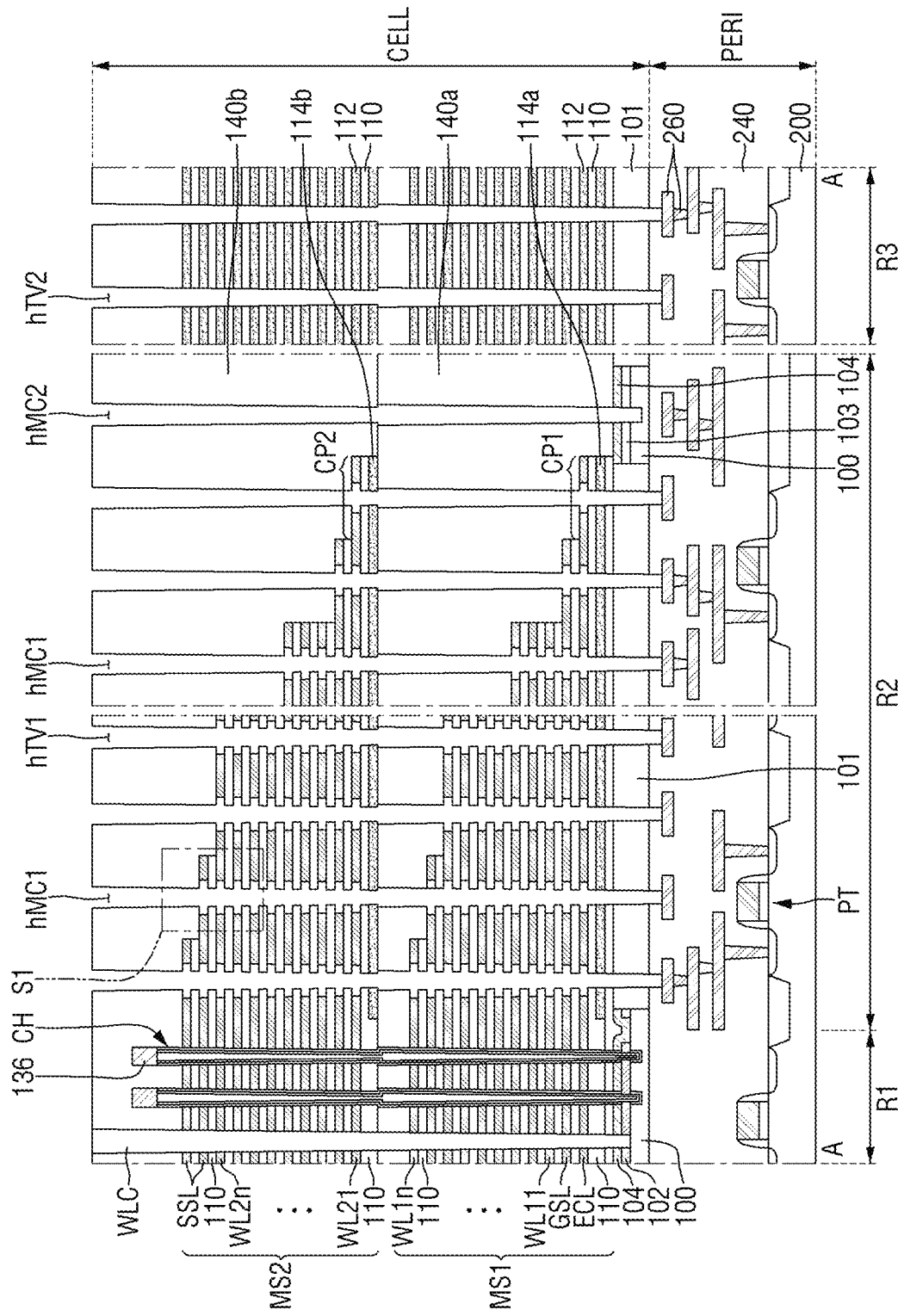
Figure 22:
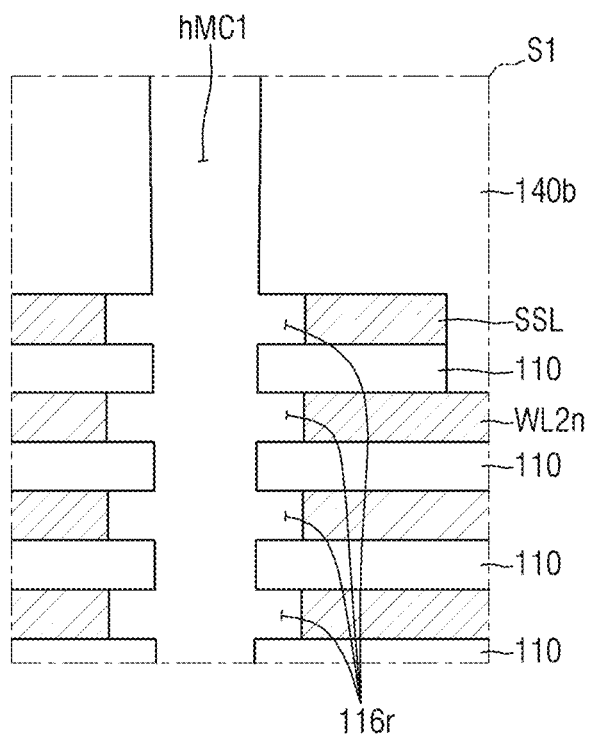

Referring to FIGS. 21 and 22, a first recessing operation for the gate electrodes ECL, GSL, WL11 to WL1n, WL21 to WL2n, and SSL is performed using the cell contact hole hMC1, the substrate contact hole hMC2, and the first through via hole hTV1.

As the first recessing operation is performed, a first recess 116r may be formed in each of the gate electrodes ECL, GSL, WL11 to WL1n, WL21 to WL2n, and SSL as shown in FIG. 22.

Figure 23:
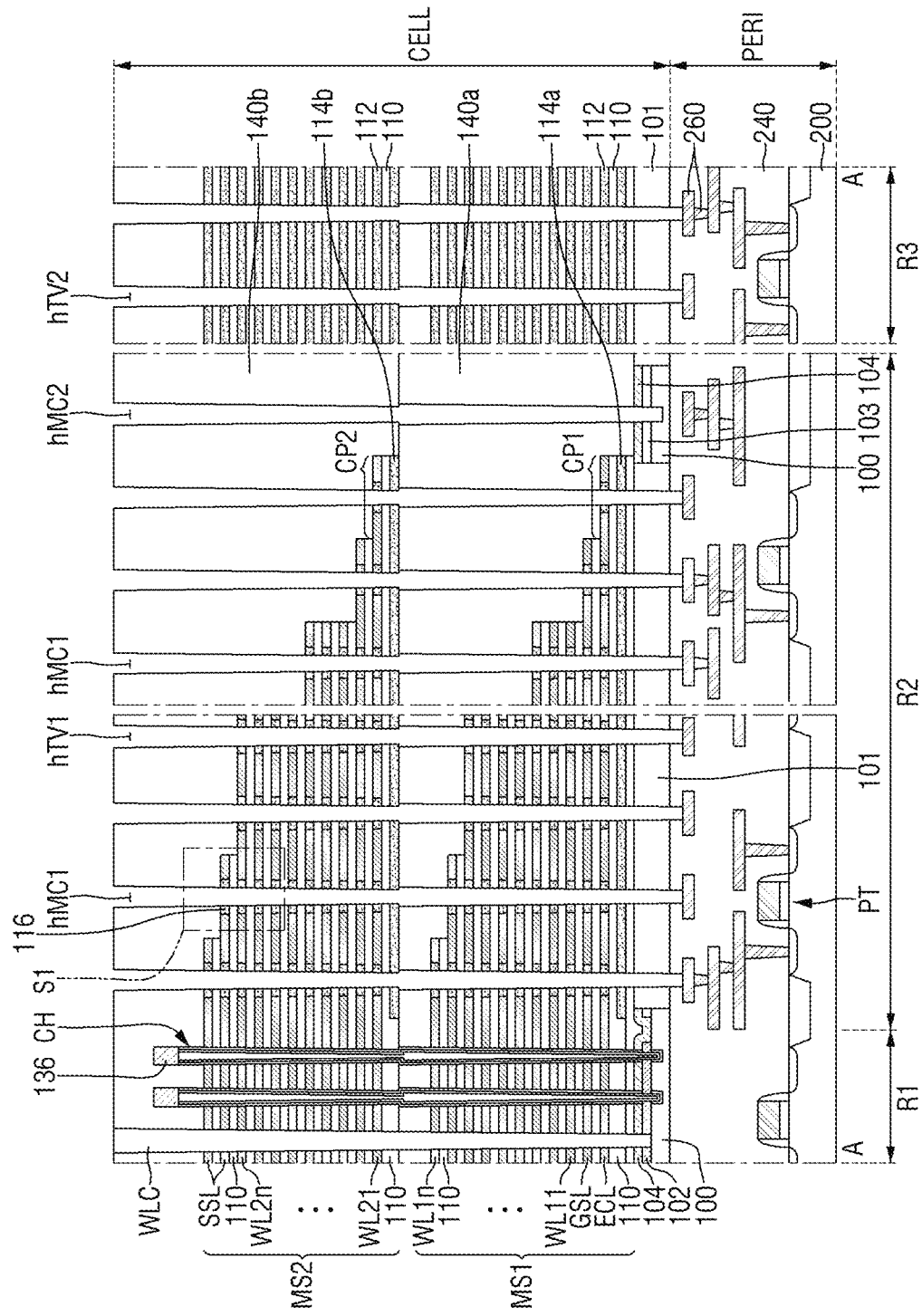
Figure 24:
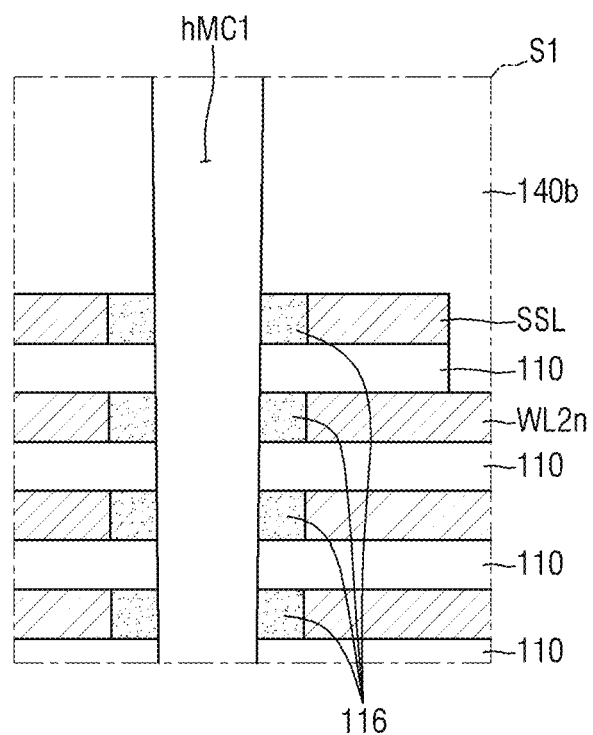

Referring to FIGS. 23 and 24, the insulating ring 116 is formed in the first mold structure MS1 and the second mold structure MS2.

For example, an insulating layer may be deposited in each of the cell contact hole hMC1, the substrate contact hole hMC2, and the first through via hole hTV1, and a recessing operation may be performed on the insulating layer. Through this, the insulating ring 116 may be formed to fill the first recess 116r of FIG. 22.

Figure 25:
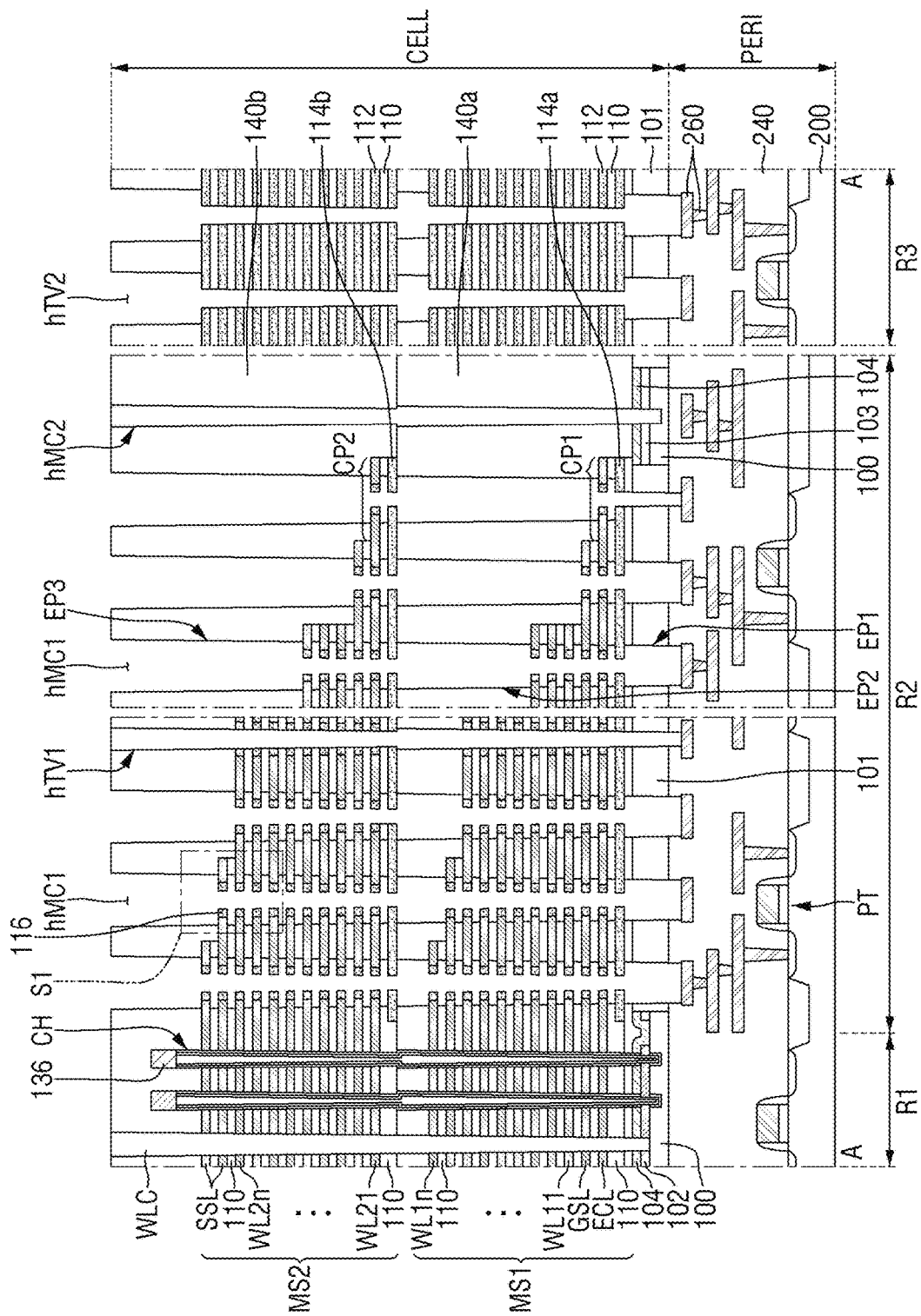
Figure 26:
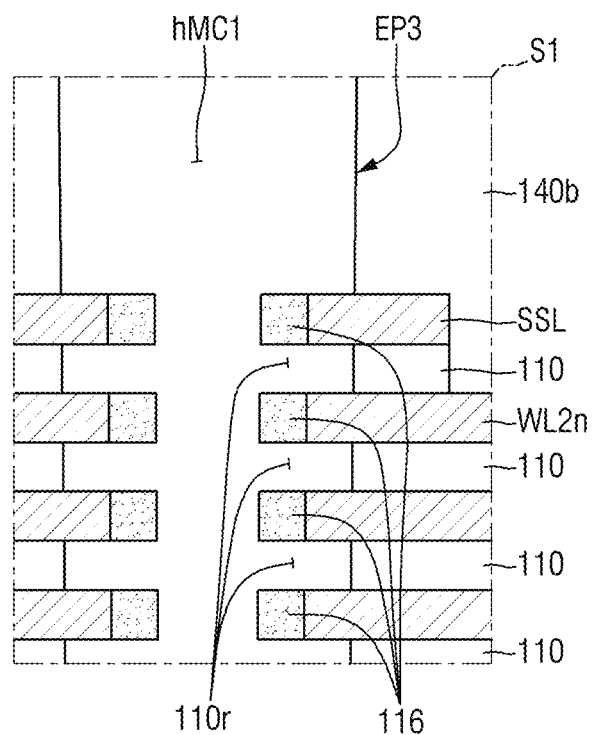

Referring to FIGS. 25 and 26, a second recessing operation is performed on the mold insulating layers 110 using the cell contact hole hMC1 and the second through via hole hTV2.

As the second recessing operation is performed, a second recess 110r may be formed in each of the mold insulating layers 110 as shown in FIG. 26. The second recess 110r may be formed at a depth greater than the depth at which the first recess 116r of FIG. 22 is formed. Accordingly, the second recess 110r may partially expose each of the gate electrodes ECL, GSL, WL11 to WL1n, WL21 to WL2n, and SSL.

Further, as the second recessing operation is performed, the first to third extension portions EP1 to EP3 may be formed. The second extension portion EP2 may expose one of the first gate electrodes ECL, GSL, and WL11 to WL1n in the first pad region CP1, and the third extension portion EP3 may expose one of the second gate electrodes WL21 to WL2n and SSL in the second pad region CP2.

In some embodiments, before the second recessing operation is performed, the substrate contact hole hMC2 and the first through via hole hTV1 may be filled with an insulating material.

Figure 27:
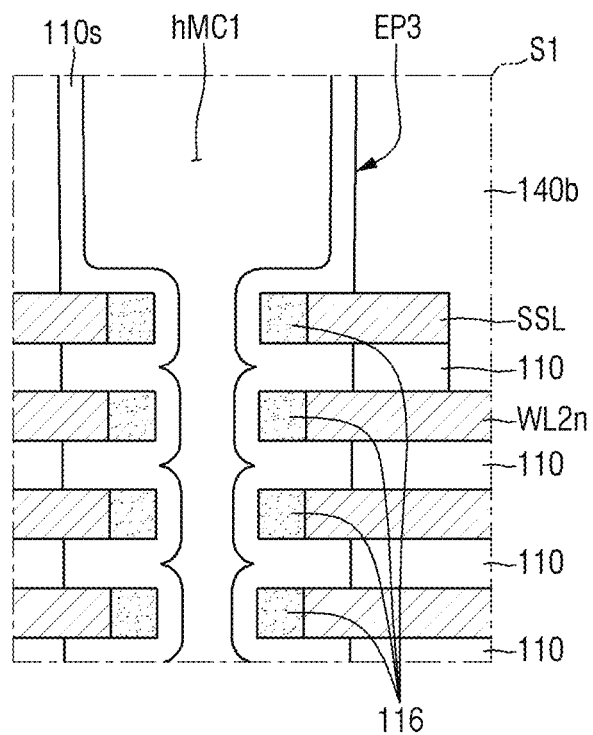

Referring to FIG. 27, a spacer layer 110s is formed in each of the cell contact hole hMC1 and the second through via hole hTV2.

The spacer layer 110s may extend along the profile of each of the cell contact hole hMC1 and the second through via hole hTV2. Further, the spacer layer 110s may fill at least a part of the second recess 110r of FIG. 26. For example, due to the relatively narrow space of the second recess 110r, the spacer layer 110s may be formed to be relatively thick by folding in the second recess 110r. In contrast, since the first to third extension portions EP1 to EP3 have a relatively wide space, the spacer layer 110s may be formed to be relatively thin in each of the first to third extension portions EP1 to EP3.

The spacer layer 110s may include an insulating material, for example, at least one of silicon oxide, silicon nitride, or silicon oxynitride, but is not limited thereto. For example, the spacer layer 110s may include silicon oxide.

Figure 28:
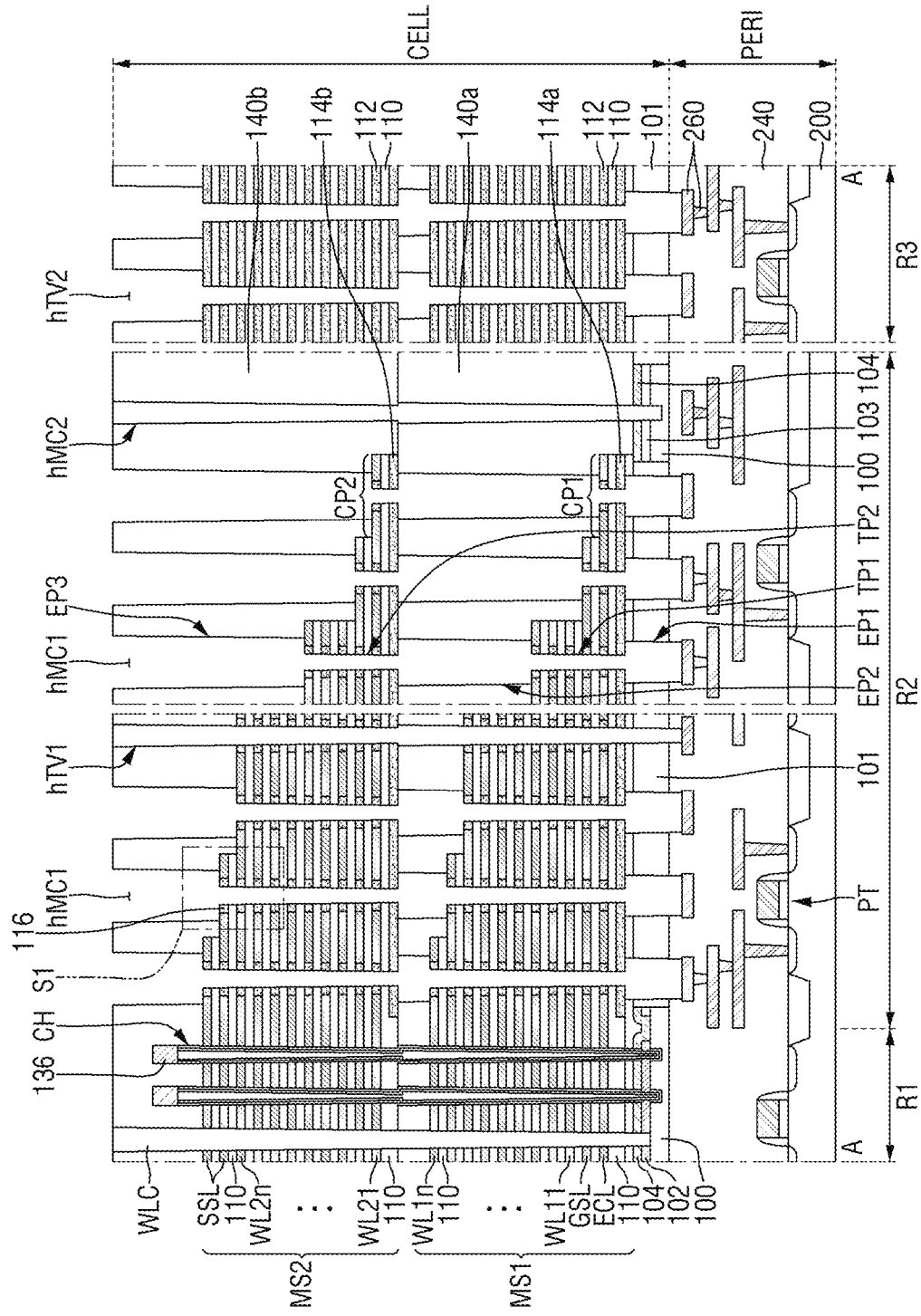
Figure 29:
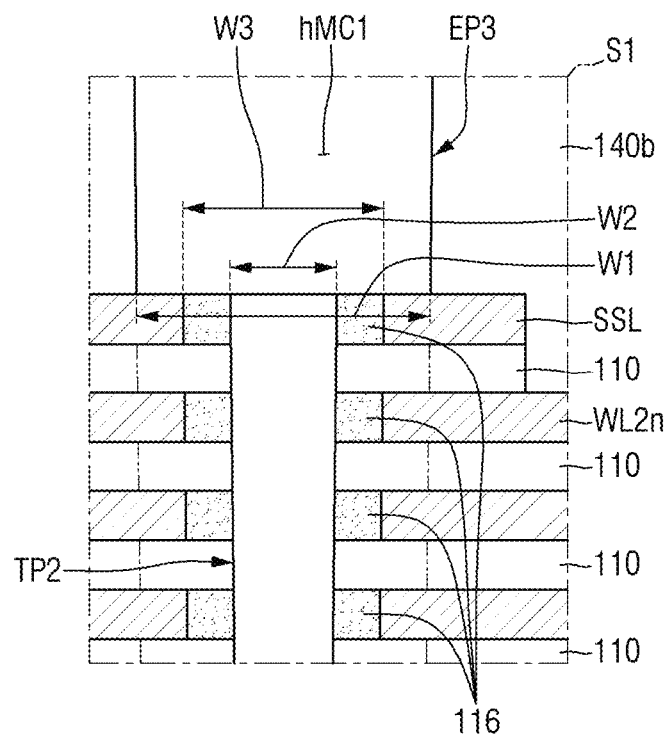

Referring to FIGS. 28 and 29, a third recessing operation is performed on the spacer layer 110s using the cell contact hole hMC1 and the second through via hole hTV2.

As the third recessing operation is performed, the second recess 110r of FIG. 26 may be filled with an insulating material again. For example, the spacer layer 110s, which has been formed to be relatively thick by folding in the second recess 110r, may not be completely removed. Through this, the gate electrodes ECL, GSL, WL11 to WL1n, WL21 to WL2n, and SSL in other regions except the first pad region CP1 and the second pad region CP2 may not be exposed by the cell contact hole hMC1 and the second through via hole hTV2. Further, the cell contact hole hMC1 and the second through via hole hTV2, each of which includes the first extension portion EP1, the first through portion TP1, the second extension portion EP2, the second through portion TP2, and the third extension portion EP3, may be formed.

Figure 30:
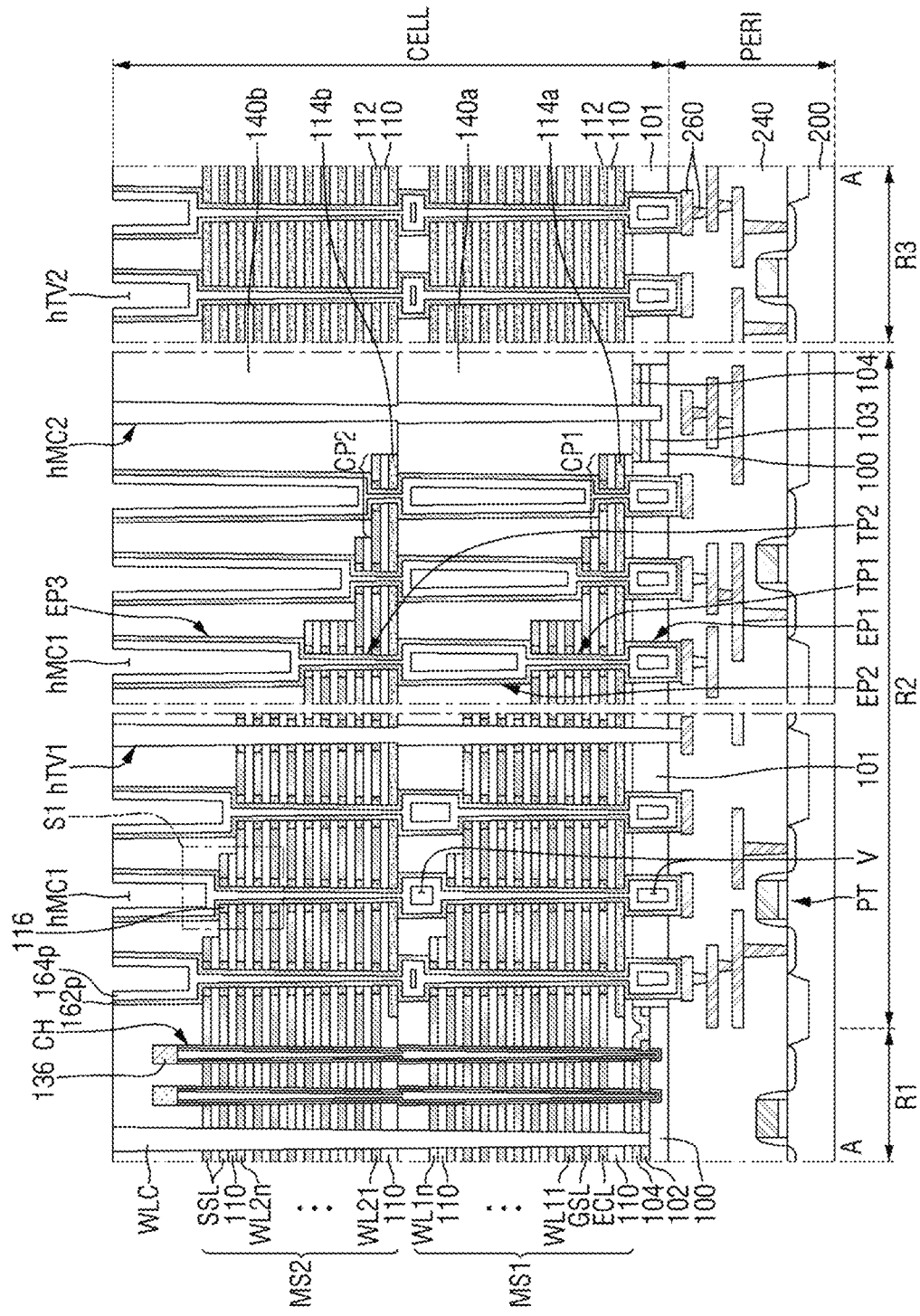
Figure 31:
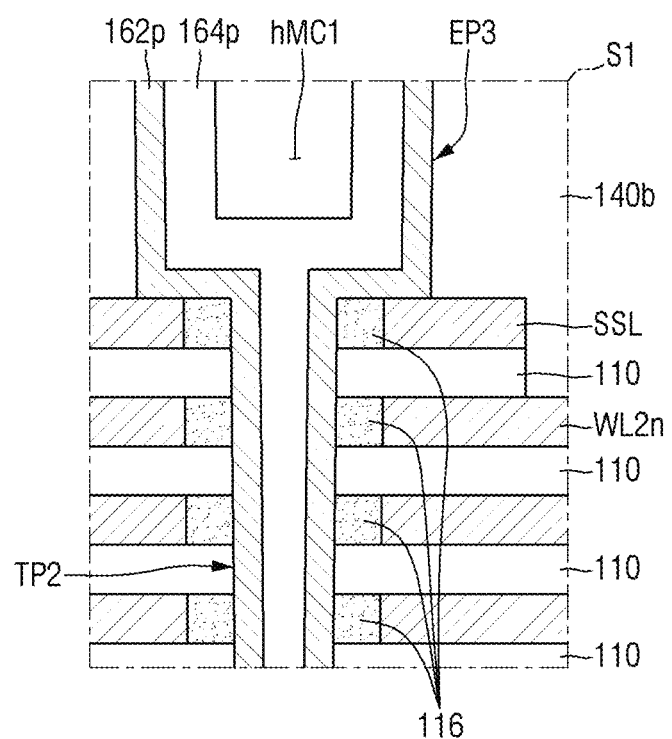

Referring to FIGS. 30 and 31, a preliminary conductive layer 162p and a preliminary insulating layer 164p are sequentially formed in the cell contact hole hMC1 and the second through via hole hTV2.

For example, the preliminary conductive layer 162p may be formed to conformally extend along the profile of each of the cell contact hole hMC1 and the second through via hole hTV2. The preliminary conductive layer 162p may be connected to a first gate electrode exposed in the first pad region CP1 among the first gate electrodes ECL, GSL, and WL11 to WL1n. Specifically, the lower conductive pattern 162 in the second extension portion EP2 may be connected to the first gate electrode exposed in the first pad region CP1 among the first gate electrodes ECL, GSL, and WL11 to WL1n.

Subsequently, the preliminary insulating layer 164p may be formed to conformally extend along the profile of the preliminary conductive layer 162p. In some embodiments, the preliminary conductive layer 162p and the preliminary insulating layer 164p may not completely fill the first extension portion EP1 and the second extension portion EP2. Accordingly, each of the first extension portion EP1 and the second extension portion EP2 may include the void V.

Figure 32:
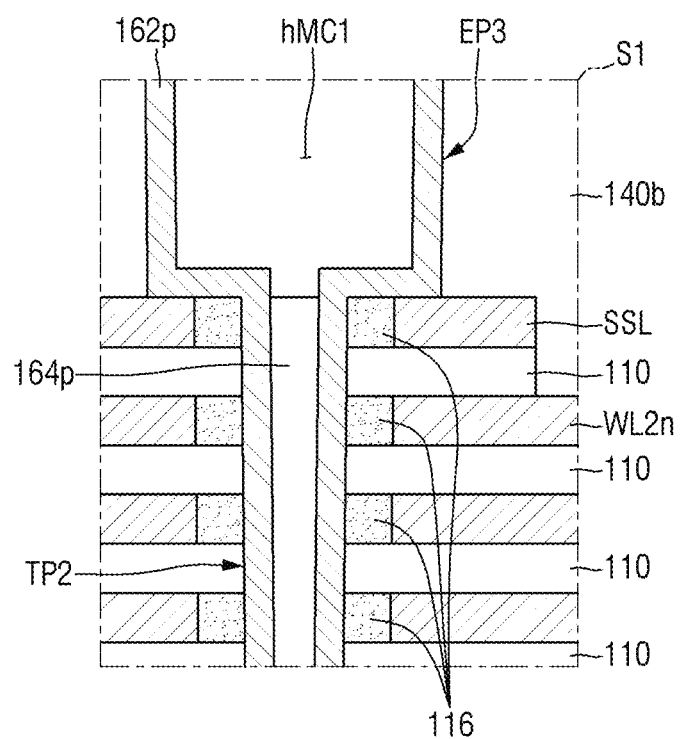

Referring to FIG. 32, a fourth recessing operation is performed on the preliminary insulating layer 164p.

As the fourth recessing operation is performed, the preliminary insulating layer 164p in the third extension portion EP3 may be removed. For example, as illustrated, the fourth recessing operation may be performed until the upper surface of the preliminary insulating layer 164p is lower than or equal to the upper surface of the string select line SSL.

Figure 33:
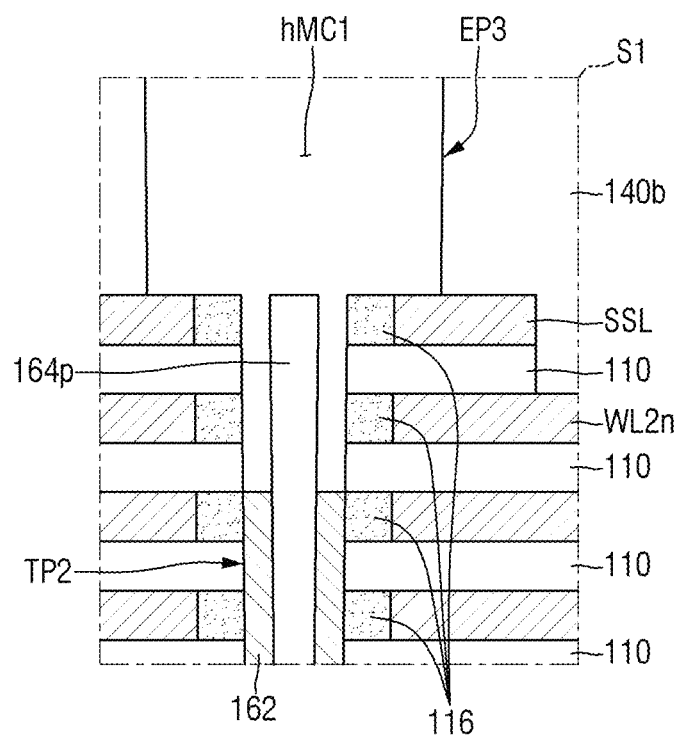

Referring to FIG. 33, the lower conductive pattern 162 is formed.

For example, a recessing operation may be performed on the preliminary conductive layer 162p. The recessing operation may be performed until the upper surface of the preliminary conductive layer 162p in FIG. 32 is lower than the upper surface of the preliminary insulating layer 164p. Through this, the lower conductive pattern 162 may be formed to be connected to one of the first gate electrodes ECL, GSL, and WL11 to WL1n. Further, the preliminary insulating layer 164p may have a shape that protrudes upward from the upper surface of the lower conductive pattern 162.

Figure 34:
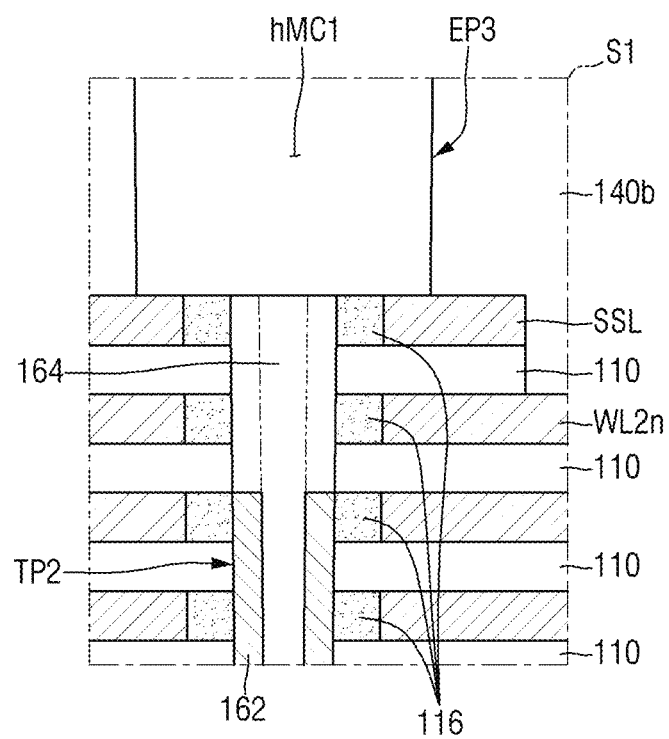

Referring to FIG. 34, the insulating pattern 164 is formed.

For example, an insulating material may fill a space which has been formed in the second through portion TP2 by the preliminary insulating layer 164p and the lower conductive pattern 162 of FIG. 33. Through this, the insulating pattern 164 may be formed to cover the upper surface of the lower conductive pattern 162.

Figure 35:
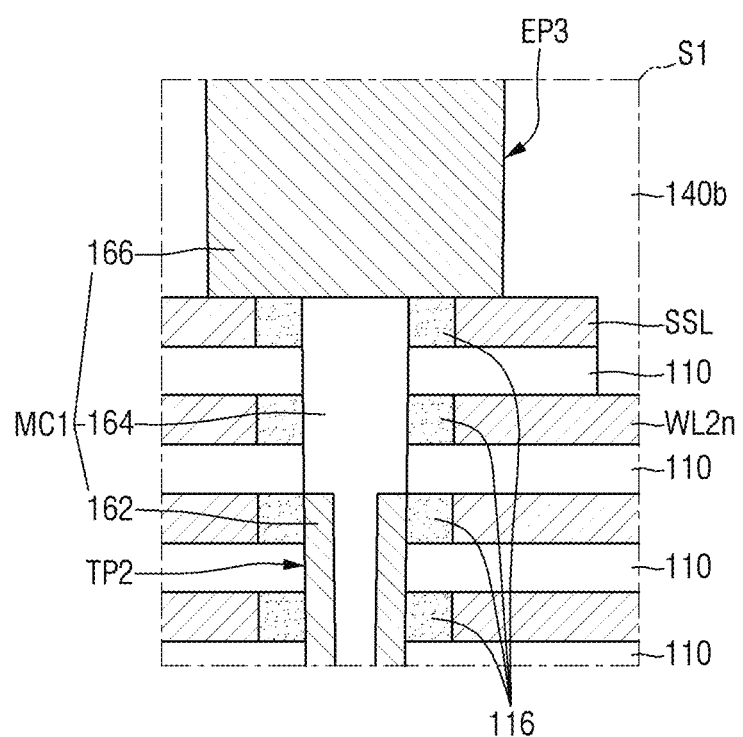

Referring to FIG. 35, the upper conductive pattern 166 is formed.

The upper conductive pattern 166 may fill the third extension portion EP3. Through this, the upper conductive pattern 166 may be formed to be connected to one of the second gate electrodes WL21 to WL2n and SSL. Further, the insulating pattern 164 may form an insulating node between the lower conductive pattern 162 and the upper conductive pattern 166.

Through this, the semiconductor memory device described above with reference to FIGS. 3 to 7 may be fabricated. In some embodiments, forming the second through via structure TV2 may be performed in the same manner as that of forming the cell contact structure MC1. In some embodiments, forming the first through via structure TV1 and the substrate contact structure MC2 may be performed simultaneously with forming the upper conductive pattern 166.

Hereinafter, an electronic system including a semiconductor memory device according to example embodiments will be described with reference to FIGS. 1 to 13 and 36 to 38.

Figure 36:
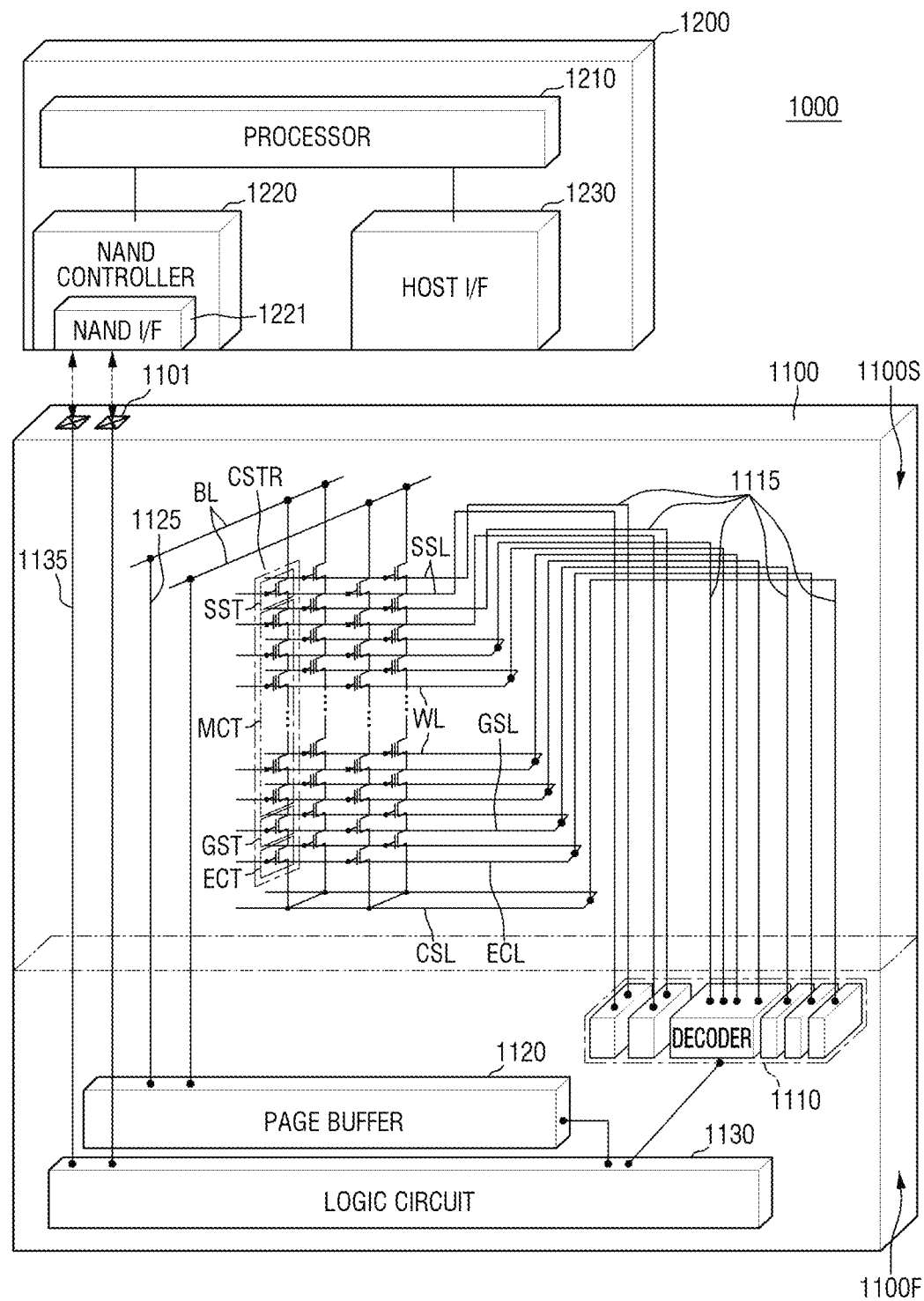
FIG. 36 is an example block diagram illustrating an electronic system according to some embodiments
Figure 37:
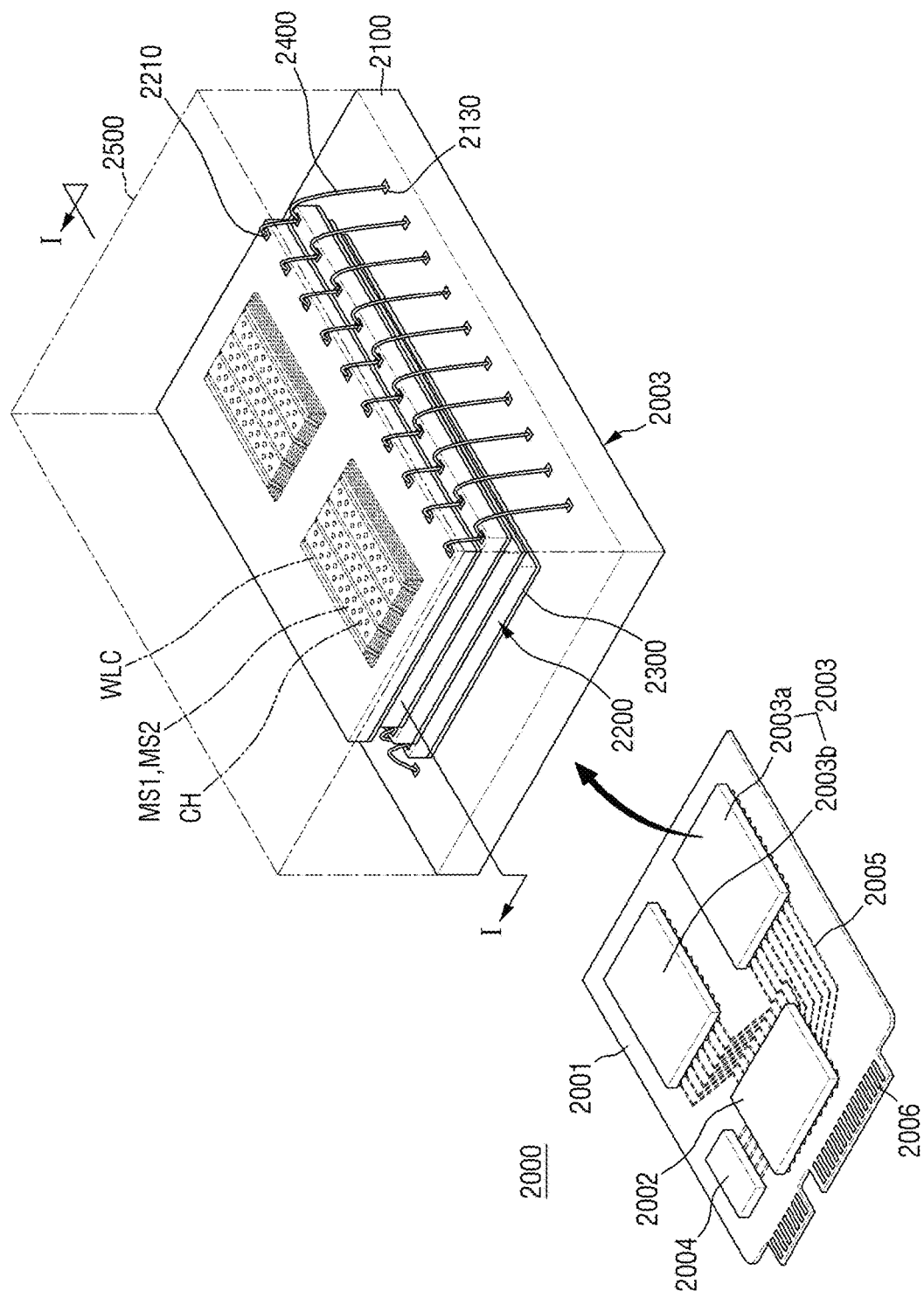
FIG. 37 is an example perspective view illustrating an electronic system according to some embodiments
Figure 38:
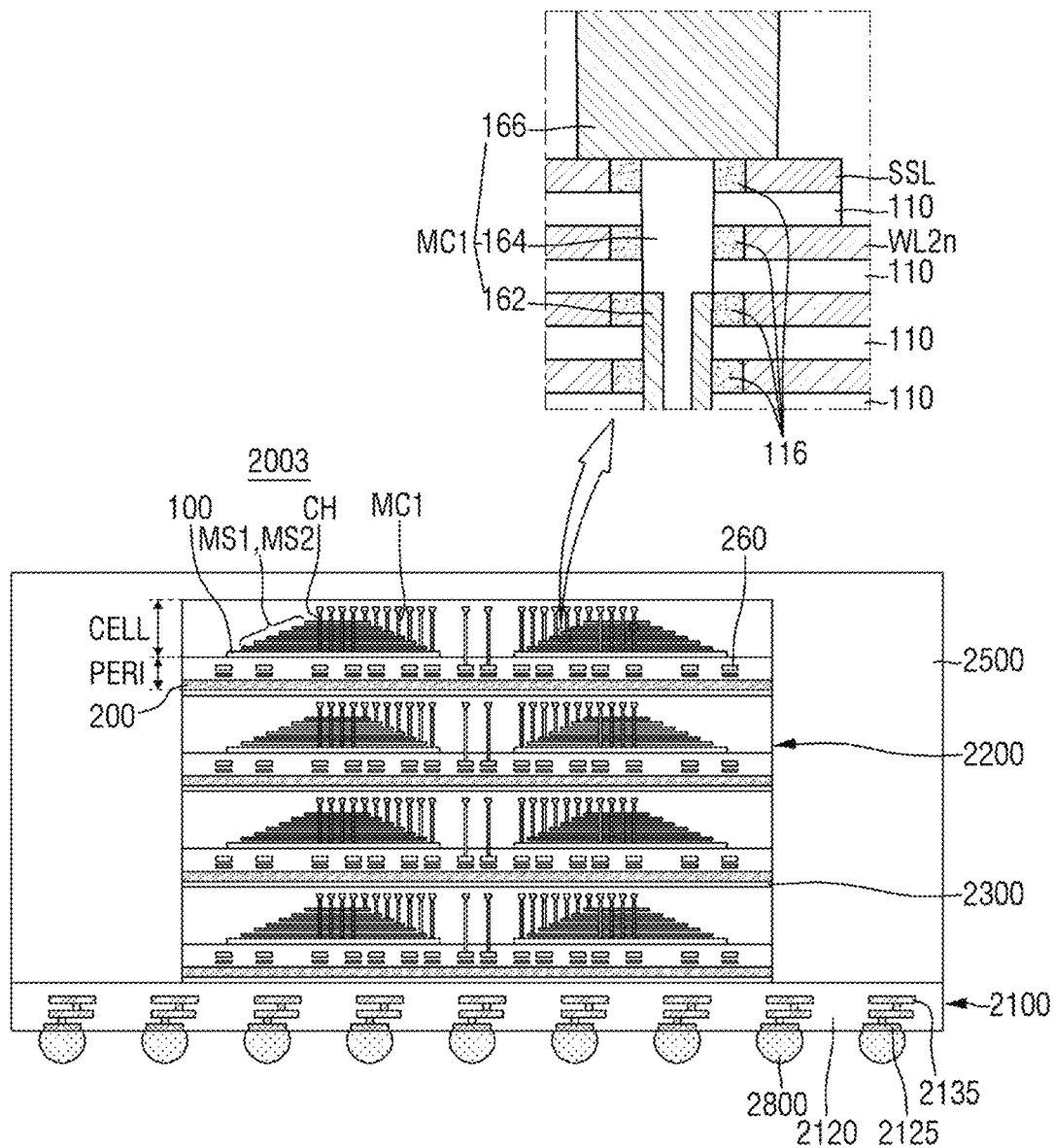
FIG. 38 is a schematic cross-sectional view taken along line I-I of FIG. 37.

FIG. 36 is an example block diagram illustrating an electronic system according to some embodiments. FIG. 37 is an example perspective view illustrating an electronic system according to some embodiments. FIG. 38 is a schematic cross-sectional view taken along line I-I of FIG. 37.

Referring to FIG. 36, an electronic system 1000 according to some embodiments may include a semiconductor memory device 1100 and a controller 1200 electrically connected to the semiconductor memory device 1100. The electronic system 1000 may be a storage device including one or a plurality of semiconductor memory devices 1100, or an electronic device including a storage device. For example, the electronic system 1000 may be a solid state drive (SSD) device including one or a plurality of semiconductor memory devices 1100, a universal serial bus (USB), a computing system, a medical device, or a communication device.

The semiconductor memory device 1100 may be a nonvolatile memory device (e.g., a NAND flash memory device) and may be, for example, the semiconductor memory device described above with reference to FIGS. 1 to 13. The semiconductor memory device 1100 may include a first structure 1100F and a second structure 1100S on the first structure 1100F.

The first structure 1100F may be a peripheral circuit structure including a decoder circuit 1110 (e.g., the row decoder 33 in FIG. 1), a page buffer 1120 (e.g., the page buffer 35 in FIG. 1), and a logic circuit 1130 (e.g., the control logic 37 in FIG. 1).

The second structure 1100S may include the common source line CSL, the plurality of bit lines BL, and the plurality of cell strings CSTR described above with reference to FIG. 2. The cell strings CSTR may be connected to the decoder circuit 1110 via the word line WL, at least one string select line SSL, and at least one ground select line GSL. Further, the cell strings CSTR may be connected to the page buffer 1120 via the bit lines BL.

In some embodiments, the common source line CSL and the cell strings CSTR may be electrically connected to the decoder circuit 1110 via first connection lines 1115 that extends from the first structure 1100F to the second structure 1100S. The first connection line 1115 may correspond to the first through via structure TV1 or the second through via structure TV2 described above with reference to FIGS. 1 to 13. That is, the first through via structure TV1 or the second through via structure TV2 may electrically connect the decoder circuit 1110 (e.g., the row decoder 33 in FIG. 1) to each of the gate electrodes ECL, GSL, WL, and SSL.

In some embodiments, the bit lines BL may be electrically connected to the page buffer 1120 via second connection lines 1125 that extend from the first structure 1100F to the second structure 1100S. The second connection line 1125 may correspond to the first through via structure TV1 or the second through via structure TV2 described above with reference to FIGS. 1 to 13. That is, the first through via structure TV1 or the second through via structure TV2 may electrically connect the bit lines BL to the page buffer 1120 (e.g., the page buffer 35 in FIG. 1).

The semiconductor memory device 1100 may communicate with the controller 1200 through an input/output pad 1101 electrically connected to the logic circuit 1130 (e.g., the control logic 37 in FIG. 1). The input/output pad 1101 may be electrically connected to the logic circuit 1130 through an input/output connection wiring 1135 extending from the first structure 1100F to the second structure 1100S.

The controller 1200 may include a processor 1210, a NAND controller 1220, and a host interface 1230. In some embodiments, the electronic system 1000 may include the plurality of semiconductor memory devices 1100. In this case, the controller 1200 may control the plurality of semiconductor memory devices 1100.

The processor 1210 may control the overall operation of the electronic system 1000 including the controller 1200. The processor 1210 may operate according to a predetermined firmware, and may access the semiconductor memory device 1100 by controlling the NAND controller 1220. The NAND controller 1220 may include a NAND interface 1221 that communicates with the semiconductor memory device 1100. A control command for controlling the semiconductor memory device 1100, data to be written to the memory cell transistors MCT of the semiconductor memory device 1100, data to be read from the memory cell transistors MCT of the semiconductor memory device 1100, and the like may be transmitted through the NAND interface 1221. The host interface 1230 may provide a communication function between the electronic system 1000 and an external host. When the control command is received from the external host through the host interface 1230, the processor 1210 may control the semiconductor memory device 1100 in response to the control command.

Referring to FIGS. 36 to 38, an electronic system according to some embodiments may include a main substrate 2001, a main controller 2002 mounted on the main substrate 2001, one or more semiconductor packages 2003, and a DRAM 2004. The semiconductor package 2003 and the DRAM 2004 may be connected to the main controller 2002 by wiring patterns 2005 formed on the main substrate 2001.

The main substrate 2001 may include a connector 2006 having a plurality of pins connected to the external host. In the connector 2006, the number and arrangement of the pins may vary depending on a communication interface between the electronic system 2000 and the external host. In some embodiments, the electronic system 2000 may communicate with the external host through any one of interfaces such as universal serial bus (USB), peripheral component interconnect express (PCIe), serial advanced technology attachment (SATA), and M-PHY for universal flash storage (UFS). In some embodiments, the electronic system 2000 may be operated by a power supplied from the external host through the connector 2006. The electronic system 2000 may further include a power management integrated circuit (PMIC) that distributes the power supplied from the external host to the main controller 2002 and the semiconductor package 2003.

The main controller 2002 may write or read data to/from the semiconductor package 2003, and may improve the operation speed of the electronic system 2000.

The DRAM 2004 may be a buffer memory for reducing a speed difference between the external host and the semiconductor package 2003 as a data storage space. The DRAM 2004 included in the electronic system 2000 may also operate as a sort of cache memory, and may also provide a space for temporarily storing data in controlling the semiconductor package 2003. When the electronic system 2000 includes the DRAM 2004, the main controller 2002 may include not only a NAND controller for controlling the semiconductor package 2003 but also a DRAM controller for controlling the DRAM 2004.

The semiconductor package 2003 may include a first semiconductor package 2003a and a second semiconductor package 2003b spaced apart from each other. Each of the first semiconductor package 2003a and the second semiconductor package 2003b may be a semiconductor package including a plurality of semiconductor chips 2200. Each of the first semiconductor package 2003a and the second semiconductor package 2003b may include a package substrate 2100, the semiconductor chips 2200 on the package substrate 2100, adhesive layers 2300 respectively disposed on the bottom surfaces of the semiconductor chips 2200, connection structures 2400 electrically connecting the semiconductor chips 2200 to the package substrate 2100, and a molding layer 2500 covering the semiconductor chips 2200 and the connection structures 2400 above the package substrate 2100.

The package substrate 2100 may be a printed circuit board including upper package pads 2130. Each of the semiconductor chips 2200 may include an input/output pad 2210. The input/output pad 2210 may correspond to the input/output pad 1101 of FIG. 36.

In some embodiments, the connection structure 2400 may be a bonding wire that electrically connects the input/output pad 2210 to the upper package pads 2130. Accordingly, in each of first semiconductor package 2003a and the second semiconductor package 2003b, the semiconductor chips 2200 may be electrically connected to each other, and may be electrically connected to the upper package pads 2130 of the package substrate 2100, by a wire bonding method. In some embodiments, in each of the first semiconductor package 2003a and the second semiconductor package 2003b, the semiconductor chips 2200 may be electrically connected to each other by a connection structure including a through silicon via (TSV) instead of the wire bonding type connection structure 2400.

In some embodiments, the main controller 2002 and the semiconductor chips 2200 may be included in one package. In some embodiments, the main controller 2002 and the semiconductor chips 2200 may be mounted on a separate interposer substrate different from the main substrate 2001, and the main controller 2002 may be connected to the semiconductor chips 2200 by wirings formed on the interposer substrate.

In some embodiments, the package substrate 2100 may be a printed circuit board. The package substrate 2100 may include a package substrate body portion 2120, the upper package pads 2130 disposed on the upper surface of the package substrate body portion 2120, lower pads 2125 arranged on the bottom surface of the package substrate body portion 2120 or exposed through the bottom surface thereof, and internal wirings 2135 electrically connecting the upper pads 2130 to the lower pads 2125 in the package substrate body portion 2120. The upper pads 2130 may be electrically connected to the connection structures 2400. The lower pads 2125 may be connected to the wiring patterns 2005 of the main substrate 2001 of the electronic system 2000 through conductive connectors 2800, as shown in FIG. 37.

Referring to FIGS. 37 and 38, in the electronic system according to some embodiments, each of the semiconductor chips 2200 may include the semiconductor memory device described above with reference to FIGS. 1 to 13. For example, each of the semiconductor chips 2200 may include the peripheral circuit region PERI and the memory cell region CELL stacked on the peripheral circuit region PERI. For example, the peripheral circuit region PERI may include the peripheral circuit board 200 and the second wiring structure 260 described above with reference to FIGS. 3 to 7. Further, for example, the memory cell region CELL may include the cell substrate 100, the mold structures MS1 and MS2, the channel structure CH, the block separation area WLC, the bit line BL, and the cell contact structure MC1 described above with reference to FIGS. 3 to 7.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While inventive concepts have been particularly shown and described with reference to example embodiments thereof, it will be understood by those of ordinary skill in the art that various changes in form and details may be made therein without departing from the spirit and scope of inventive concepts as defined by the following claims. It is therefore desired that the presented embodiments be considered in all respects as illustrative and not restrictive, reference being made to the appended claims rather than the foregoing description to indicate the scope of inventive concepts.

What is claimed is:
1. A semiconductor memory device comprising:
a cell substrate comprising a cell array region and an extension region;
a first mold structure on the cell substrate, the first mold structure comprising a plurality of first gate electrodes sequentially stacked on the cell array region and stacked in a stepwise manner on the extension region;
a second mold structure on the first mold structure, the second mold structure comprising a plurality of second gate electrodes sequentially stacked on the first mold structure on the cell array region and stacked in a stepwise manner on the extension region;

a channel structure passing through the first mold structure and the second mold structure on the cell array region; and a cell contact structure passing through the first mold structure and the second mold structure on the extension region, wherein the cell contact structure comprises a lower conductive pattern connected to one of the plurality of first gate electrodes, an upper conductive pattern connected to one of the plurality of second gate electrodes, and an insulating pattern separating the lower conductive pattern from the upper conductive pattern.

2. The semiconductor memory device of claim 1, further comprising:

an insulating ring between the cell contact structure and each of the plurality of first gate electrodes and between the cell contact structure and each of the plurality of second gate electrodes.

3. The semiconductor memory device of claim 1, wherein the cell contact structure comprises a first extension portion under the first mold structure, a second extension portion between the first mold structure and the second mold structure, a third extension portion on the second mold structure, a first through portion passing through the first mold structure and connecting the first extension portion to the second extension portion, and a second through portion passing through the second mold structure and connecting the second extension portion to the third extension portion, and a width of the first extension portion, a width of the second extension portion, and a width of the third extension portion each are greater than a width of the first through portion and a width of the second through portion.

4. The semiconductor memory device of claim 3, wherein the lower conductive pattern is in the first extension portion, the second extension portion, the first through portion, and the second through portion, the upper conductive pattern is in the third extension portion, and at least a part of the insulating pattern is in the second through portion and separates the lower conductive pattern from the upper conductive pattern.

5. The semiconductor memory device of claim 3, further comprising:

a first stopper layer between the cell substrate and the first mold structure; and a second stopper layer between the first mold structure and the second mold structure, wherein an upper surface of the first extension portion is defined by a bottom surface of the first stopper layer, and an upper surface of the second extension portion is defined by a bottom surface of the second stopper layer.

6. The semiconductor memory device of claim 1, further comprising:

a first interlayer insulating layer on the cell substrate, the first interlayer insulating layer covering the first mold structure;

a second interlayer insulating layer on the first interlayer insulating layer, the second interlayer insulating layer covering the second mold structure; and a substrate contact structure passing through the first interlayer insulating layer and the second interlayer insulating layer, wherein the substrate contact structure is connected to the cell substrate.

7. The semiconductor memory device of claim 1, further comprising:

a through via structure, wherein the cell substrate includes a through region, each of the first mold structure and the second mold structure comprises a plurality of mold sacrificial layers sequentially stacked on the cell substrate on the through region, the through via structure passes through the first mold structure and the second mold structure on the through region.

8. The semiconductor memory device of claim 1, further comprising:

a third mold structure between the first mold structure and the second mold structure on the extension region, wherein the third mold structure comprises a plurality of mold sacrificial layers sequentially stacked on the first mold structure, the lower conductive pattern passes through the third mold structure, and the lower conductive pattern is connected to one of the plurality of first gate electrodes.

9. The semiconductor memory device of claim 1, further comprising:

a peripheral circuit board;

a peripheral circuit element on the peripheral circuit board;

an inter-wiring insulating layer covering the peripheral circuit element; and a wiring structure in the inter-wiring insulating layer, the wiring structure connecting the peripheral circuit element to the cell contact structure, wherein the cell substrate is on the inter-wiring insulating layer.

10. The semiconductor memory device of claim 9, further comprising:

a through via structure passing through the first mold structure and the second mold structure on the extension region, wherein the through via structure connects one of the lower conductive pattern and the upper conductive pattern to the wiring structure.

11. A semiconductor memory device comprising:

a cell substrate comprising a cell array region and an extension region;

a first mold structure on the cell substrate, the first mold structure comprising a plurality of first gate electrodes sequentially stacked on the cell array region, each of the plurality of first gate electrodes comprising a first pad region in which a part of an upper surface thereof is exposed on the extension region;

a second mold structure on the first mold structure, the second mold structure comprising a plurality of second gate electrodes sequentially stacked on the first mold structure, each of the plurality of second gate electrodes comprising a second pad region in which a part of an upper surface thereof is exposed on the extension region;

a channel structure extending in a vertical direction intersecting an upper surface of the cell substrate on the cell array region, the channel structure passing through the first mold structure and the second mold structure;

a word line cutting region extending in a first direction crossing the vertical direction to cut the first mold structure and the second mold structure;

a bit line extending in a second direction crossing the first direction and the vertical direction, the bit line connected to the channel structure;

a cell contact structure extending in the vertical direction on the extension region, the cell contact structure passing through the first mold structure and the second mold structure; and an insulating ring between the cell contact structure and each of the plurality of first gate electrodes and between the cell contact structure and each of the plurality of second gate electrodes, wherein the cell contact structure comprises a lower conductive pattern in contact with the first pad region of a corresponding first gate electrode among the plurality of first gate electrodes, an upper conductive pattern in contact with the second pad region of a corresponding second gate electrode among the plurality of second gate electrodes, and an insulating pattern separating the lower conductive pattern from the upper conductive pattern.

12. The semiconductor memory device of claim 11, wherein the cell contact structure comprises a first extension portion under the first mold structure, a second extension portion between the first mold structure and the second mold structure, a third extension portion on the second mold structure, a first through portion passing through the first mold structure and connecting the first extension portion to the second extension portion, and a second through portion passing through the second mold structure and connecting the second extension portion to the third extension portion, and a width of the first extension portion, a width of the second extension portion, and a width of the third extension portion each are greater than a width of the first through portion and a width of the second through portion.

13. The semiconductor memory device of claim 12, wherein the lower conductive pattern is in the first extension portion, the second extension portion, the first through portion, and the second through portion, the upper conductive pattern is in the third extension portion, and at least a part of the insulating pattern is in the second through portion and separates the lower conductive pattern from the upper conductive pattern.

14. The semiconductor memory device of claim 13, wherein the lower conductive pattern extends along a profile of each of the first extension portion, the first through portion, and the second extension portion, and an other part of the insulating pattern extends along a profile of the lower conductive pattern.

15. The semiconductor memory device of claim 13, wherein each of the first extension portion and the second extension portion comprises a void.

16. The semiconductor memory device of claim 12, further comprising:

a first stopper layer between the cell substrate and the first mold structure; and a second stopper layer between the first mold structure and the second mold structure, wherein the first extension portion is between the cell substrate and the first stopper layer, and the second extension portion is between the first mold structure and the second stopper layer.

17. The semiconductor memory device of claim 16, wherein the word line cutting region does not cut the first stopper layer and the second stopper layer.

18. An electronic system comprising:

a main substrate;

a semiconductor memory device on the main substrate; and a controller on the main substrate, the controller being electrically connected to the semiconductor memory device, wherein the semiconductor memory device comprises a cell substrate, a first mold structure on the cell substrate, a second mold structure on the first mold structure, a channel structure, and a cell contact structure, the cell substrate comprises a cell array region and an extension region, the first mold structure comprises a plurality of first gate electrodes sequentially stacked on the cell array region and stacked in a stepwise manner on the extension region, the second mold structure comprises a plurality of second gate electrodes sequentially stacked on the first mold structure and stacked in a stepwise manner on the extension region, the channel structure passes through the first mold structure and the second mold structure on the cell array region, the cell contact structure passes through the first mold structure and the second mold structure on the extension region, wherein the cell contact structure comprises a lower conductive pattern electrically connecting one of the plurality of first gate electrodes to the controller, an upper conductive pattern electrically connecting one of the plurality of second gate electrodes to the controller, and an insulating pattern separating the lower conductive pattern from the upper conductive pattern.

19. The electronic system of claim 18, further comprising:

an insulating ring between the cell contact structure and each of the plurality of first gate electrodes and between the cell contact structure and each of the plurality of second gate electrodes.

20. The electronic system of claim 18, wherein the cell contact structure comprises a first extension portion under the first mold structure, a second extension portion between the first mold structure and the second mold structure, a third extension portion on the second mold structure, a first through portion passing through the first mold structure and connecting the first extension portion to the second extension portion, and a second through portion passing through the second mold structure and connecting the second extension portion to the third extension portion, and a width of the first extension portion, a width of the second extension portion, and a width of the third extension portion each are greater than a width of the first through portion and a width of the second through portion.

* * * * *